United States Patent
Goto et al.

(10) Patent No.: US 6,904,071 B1
(45) Date of Patent: Jun. 7, 2005

(54) SEMICONDUCTOR LASER DEVICE AND METHOD OF FABRICATING THE SAME

(75) Inventors: Takenori Goto, Moriguchi (JP); Nobuhiko Hayashi, Osaka (JP)

(73) Assignee: Sanyo Electric Co., Ltd., Osaka (JP)

(*) Notice: Subject to any disclaimer, the term of this patent is extended or adjusted under 35 U.S.C. 154(b) by 0 days.

(21) Appl. No.: 09/532,791

(22) Filed: Mar. 22, 2000

(30) Foreign Application Priority Data

Mar. 24, 1999 (JP) ............................................. 11-079470
Mar. 8, 2000 (JP) ...................................... 2000-063271

(51) Int. Cl.⁷ ................................................ H01S 5/00
(52) U.S. Cl. ........................................... 372/43; 372/45
(58) Field of Search .............................. 372/96, 43–50, 372/75, 54; 257/101, 103, 97; 438/46

(56) References Cited

U.S. PATENT DOCUMENTS

| | | | |
|---|---|---|---|
| 5,390,205 A | 2/1995 | Mori et al. | |
| 5,585,649 A | 12/1996 | Ishikawa et al. | |
| 5,742,629 A | 4/1998 | Nishikawa et al. | 372/46 |
| 5,822,348 A * | 10/1998 | Fujii | 372/45 |
| 5,835,516 A * | 11/1998 | Miyashita et al. | 372/46 |
| 5,920,586 A | 7/1999 | Nagai | |
| 5,956,361 A * | 9/1999 | Ikeda et al. | 372/46 |
| 5,987,048 A * | 11/1999 | Ishikawa et al. | 372/46 |
| 6,064,079 A * | 5/2000 | Yamamoto et al. | 257/101 |
| 6,111,275 A * | 8/2000 | Hata | 257/97 |
| 6,118,801 A * | 9/2000 | Ishikawa et al. | 372/46 |
| 6,208,681 B1 * | 3/2001 | Thornton | 372/96 |
| 6,238,947 B1 * | 5/2001 | Shakuda | 438/94 |
| 6,281,526 B1 * | 8/2001 | Nitta et al. | 257/103 |
| 6,284,559 B1 * | 9/2001 | Hata | 438/46 |
| 6,298,079 B1 * | 10/2001 | Tanaka et al. | 372/46 |
| 6,317,446 B1 * | 11/2001 | Wipiejewski | 372/46 |
| 6,320,893 B1 * | 11/2001 | Ueki | 372/96 |
| 6,522,676 B1 * | 2/2003 | Goto et al. | 372/43 |

FOREIGN PATENT DOCUMENTS

| | | | |
|---|---|---|---|
| EP | 0 851 542 | 7/1998 | |
| JP | 60-3181 | 1/1985 | |
| JP | 60003181 | * 1/1985 | ............. H01S/3/18 |
| JP | 60-003181 | * 9/1985 | ............. H01S/3/18 |
| JP | 6-085381 | 3/1994 | |
| JP | 6-196812 | 7/1994 | |
| JP | 8-250805 | 9/1996 | |
| JP | 9-036491 | 2/1997 | |
| JP | 10-084165 | 3/1998 | |
| JP | 10-93199 | 4/1998 | |
| JP | 9-097950 | 4/1998 | |
| JP | 10-294534 | 11/1998 | |
| JP | 02001068786 A | * 3/2001 | ........... H01S/5/223 |

OTHER PUBLICATIONS

Copy of Notice of Reasons for Refusal in the counterpart Japanese application (JP2000–063271) dated Apr. 15, 2003 and translation.
European Search Report dated Sep. 3, 2003 in corresponding application No. EP 00 30 2341.
IEEE Journal of Quantum Electronics, vol. 29, No. 5, May 1993, pp. 1330–1336.

* cited by examiner

Primary Examiner—Mingun O Harvey
Assistant Examiner—Tuan N. Nguyen
(74) Attorney, Agent, or Firm—Westerman Hattori Daniels & Adrian, LLP

(57) ABSTRACT

An n-contact layer, an n-cladding layer, an MQW active layer, and a p-first cladding layer are formed in this order on a sapphire substrate. An n-current blocking layer having a striped opening is formed on the p-first cladding layer. The width of the striped opening gradually increases from W2 to W1 as the depth thereof decreases from a lower layer to an upper layer in the current blocking layer. A p-second cladding layer is formed on the n-current blocking layer and on the p-first cladding layer inside the striped opening. The p-second cladding layer comprises a lower layer having the width W2 at its lower end and an upper layer having a width W1 lager than the width W2.

21 Claims, 16 Drawing Sheets

US 6,904,071 B1

SEMICONDUCTOR LASER DEVICE AND METHOD OF FABRICATING THE SAME

BACKGROUND OF THE INVENTION

FIELD OF THE INVENTION

The present invention relates to a semiconductor laser device having a current blocking layer (a current confinement layer) for confining a region of a current flowing into an active layer and a method of fabricating the same.

BACKGROUND OF THE INVENTION

In semiconductor laser devices, structures for limiting a current in a striped shape have been widely used for the purpose of decreasing an operating current and limiting the position of a light emitting spot. One of the structures for limiting a current in a striped shape is a structure having a current blocking layer for cutting off a current in a region, other than an opening, provided in a striped shape.

FIG. 22 is a schematic sectional view showing an example of the construction of a conventional GaN based semiconductor laser device having a current blocking layer.

In a semiconductor laser device 101 shown in FIG. 22, an n-contact layer 103 composed of n-GaN, an n-cladding layer 104 composed of n-Al$_n$Ga$_{1-a}$N, a multi quantum well active layer (hereinafter referred to as an MQW active layer) 105, and a p-first cladding layer 106a composed of p-Al$_b$Ga$_{1-b}$N are formed in this order on a sapphire substrate 102.

The MQW active layer 105 has a multi quantum well layer constructed by alternately stacking a plurality of quantum well layers composed of In$_x$Ga$_{1-x}$N and a plurality of quantum barrier layers composed of In$_y$Ga$_{1-y}$N, where x>y.

An n-current blocking layer 107 composed of n-Al$_c$Ga$_{1-c}$N having a striped opening 108 is formed on the p-first cladding layer 106a. A p-second cladding layer 106b composed of p-Al$_d$Ga$_{1-d}$N and a p-contact layer 109 composed of p-GaN are formed in this order on the n-current blocking layer 107 and on the p-first cladding layer 106a inside the striped opening 108. A dotted line drawn in the striped opening 108 indicates the boundary between the p-first cladding layer 106a and the p-second cladding layer 106b. Here, $0 \leq a < c$, $0 \leq b < c$, and $0 \leq d < c$.

A partial region from the p-contact layer 109 to the n-contact layer 103 is etched away, so that a surface of the n-contact layer 103 is exposed. A p electrode 110 is formed on the p-contact layer 109, and an n electrode 111 is formed on the exposed surface of the n-contact layer 103.

FIG. 23 is a schematic sectional view showing another example of the construction of a conventional GaN based semiconductor laser device having a current blocking layer.

In a semiconductor laser device 201 shown in FIG. 23, an n-contact layer 203 composed of n-GaN, an n-cladding layer 204 composed of n-Al$_e$Ga$_{1-e}$N, an MQW active layer 205, and a p-first cladding layer 206a composed of p-Al$_f$Ga$_{1-f}$N are formed in this order on a sapphire substrate 202.

The MQW active layer 205 has a multi quantum well structure constructed by alternately stacking a plurality of quantum well layers composed of In$_s$Ga$_{1-s}$N and a plurality of barrier layers composed of In$_t$Ga$_{1-t}$N, where s>t.

A p-second cladding layer 206b in a ridge shape composed of p-Al$_f$Ga$_{1-f}$N is formed on the p-first cladding layer 206a. An n-current blocking layer 207 composed of n-Al$_g$Ga$_{1-g}$N having a striped opening 208 is formed on the p-first cladding layer 206a on both sides of the p-second cladding layer 206b. A p-contact layer 209 composed of p-GaN is formed on the n-current blocking layer 207 and on the p-second cladding layer 206b inside the striped opening 208. A dotted line drawn in the striped opening 208 indicates the boundary between the p-first cladding layer 206a and the p-second cladding layer 206b. Here, $0 \leq e < g$ and $0 \leq f < g$.

A partial region from the p-contact layer 209 to the n-contact layer 203 is etched away, so that a surface of the n-contact layer 203 is exposed. A p electrode 210 is formed on the p-contact layer 209, and an n electrode 211 is formed on the exposed surface of the n-contact layer 203.

In the semiconductor laser devices 101 and 201, the Al composition ratios of the n-current blocking layers 107 and 207 are respectively higher than the Al composition ratios of the p-cladding layers 106a and 106b and the p-cladding layers 206a and 206b. Accordingly, the refractive indexes of the n-current blocking layers 107 and 207 are respectively lower than the refractive indexes of the p-cladding layers 106a and 106b and the p-cladding layers 206a and 206b. Consequently, effective refractive indexes in regions of the MQW active layers 105 and 205 under the striped openings 108 and 208 are respectively higher than effective refractive indexes in regions of the MQW active layers 105 and 205 under the n-current blocking layers 107 and 207. Accordingly, light is concentrated on the regions under the striped openings 108 and 208. A semiconductor laser device having a real refractive index guided structure is thus realized.

The semiconductor laser devices 101 and 201 shown in FIGS. 22 and 23 can have a loss guided structure by respectively composing the n-current blocking layers 107 and 207 of InGaN having a smaller band-gap than those of the active layers.

In the conventional semiconductor laser device 101 shown in FIG. 22, the n-current blocking layer 107 has the striped opening 108 which is rectangular in cross section. The width W of the striped opening 108 is approximately constant irrespective of the depth thereof.

In the conventional semiconductor laser device 201 shown in FIG. 23, the n-current blocking layer 207 has the striped opening 208 which is trapezoidal in cross section. The width of the striped opening 208 gradually decreases as the depth thereof decreases, that is, the lower width W2 is larger than the upper width W1.

In the semiconductor laser device 101 shown in FIG. 22, if the width W of the striped opening 108 is increased, an area occupied by the striped opening 108 in a plane shape of the semiconductor laser device 101 is increased. Even if the same operating voltage is applied to the semiconductor laser device 101, a current flowing into the MQW active layer 105 from the p-contact layer 109 through the striped opening 108 is increased. If the same light output power is achieved, the operating voltage can be decreased.

If the width W of the striped opening 108 is increased, however, the width of a light emitting spot in a direction parallel to the MQW active layer 105 is increased. Accordingly, the aspect ratio of laser light emitted from the semiconductor laser device 101 (a vertical divergence/horizontal divergence of emitted laser light) is increased.

Conversely, if the width W of the striped opening 108 is decreased, the width of the light emitting spot in the direction parallel to the MQW active layer 105 is decreased. Accordingly, the aspect ratio of the emitted laser light is decreased. However, a current flowing into the MQW active layer 105 from the p-contact layer 109 through the striped opening 108 is decreased. Accordingly, the operating voltage must be increased in order to make light output power constant.

Similarly in the semiconductor laser device 201 shown in FIG. 23, when the widths W1 and W2 of the striped opening 208 are increased, an operating voltage for obtaining the same light output power can be decreased, while the aspect ratio of emitted laser light is increased. Conversely, if the widths W1 and W2 of the striped opening 208 are decreased, the aspect ratio of the emitted laser light can be decreased, while the operating voltage is increased.

On the other hand, the realization of a semiconductor laser device in which an operating voltage is low and low-noise characteristics is obtained depending on the use has been desired.

SUMMARY OF THE INVENTION

An object of the present invention is to provide a semiconductor laser device capable of reducing an operating voltage and improving the aspect ratio of emitted laser light and a method fabricating the same.

Another object of the present invention is to provide a semiconductor laser device capable of reducing an operating voltage and performing self-sustained pulsation and a method of fabricating the same.

A semiconductor laser device according to an aspect of the present invention comprises a first semiconductor layer including an active layer; a striped second semiconductor layer formed on the first semiconductor layer; and a current blocking layer formed on the first semiconductor layer on both sides of the second semiconductor layer, the second semiconductor layer including a cladding layer which comprises a lower layer having a first width at its lower end and an upper layer having a second width larger than the first width at its lower end and has a larger band-gap than that of the active layer.

In the semiconductor laser device, the cladding layer comprises the lower layer having a first width at its lower end and the upper layer having a second width larger than the first width at its lower end. Accordingly, the resistance of the upper layer in the cladding layer is decreased. Consequently, an operating voltage is reduced.

The width at the lower end of the lower layer in the cladding layer is smaller than the width of the upper layer in the cladding layer. Accordingly, the width of a light emitting spot in a direction parallel to the active layer can be decreased. In this case, it is possible to decrease the aspect ratio of emitted laser light.

On the other hand, the width of a current injection region is defined by the width at the lower end of the lower layer in the cladding layer. When the width of the light emitting spot is defined by the width at the lower end of the upper layer in the cladding layer, therefore, the width of the current injection region is smaller than the width of the light emitting spot. In this case, both sides of the current injection region can function as a saturable light absorbing member, so that self-sustained pulsation occurs. As a result, low-noise characteristics can be obtained.

The cladding layer may have the function of confining light in the active layer. Consequently, the light is confined in a direction perpendicular to the active layer.

The semiconductor laser device may further comprise a third semiconductor layer formed on the cladding layer and having a carrier concentration which is not less than that of the cladding layer. The third semiconductor layer may be a contact layer. In this case, good ohmic contact can be obtained between the third semiconductor layer and an electrode.

The semiconductor laser device may further comprise a third semiconductor layer formed on the cladding layer and having a smaller band-gap than that of the cladding layer. The third semiconductor layer may be a contact layer. In this case, the carrier concentration of the third semiconductor layer can be increased. Accordingly, good ohmic contact can be obtained between the third semiconductor layer and an electrode.

The lower layer in the cladding layer may have the first width which is approximately constant from its lower end to its upper end, and the upper layer in the cladding layer may have a second width which is approximately constant from its lower end to its upper end.

In this case, a cladding layer having a reverse two-step shaped stripe structure comprising a lower layer having a side surface approximately perpendicular to an active layer and an upper layer having a side surface approximately perpendicular to the active layer is obtained.

The lower layer in the cladding layer may have the first width which is approximately constant from its lower end to its upper end, and the upper layer in the cladding layer may have a width which gradually decreases upward from the second width.

In this case, a cladding layer having a reverse two-step shaped stripe structure comprising a lower layer having a side surface approximately perpendicular to an active layer and an upper layer having a side surface inclined from the active layer is obtained. Particularly, the width at the upper end of the upper layer in the cladding layer can be increased by increasing the width at the lower end of the upper layer in the cladding layer. Consequently, the resistance of the upper layer in the cladding layer is decreased.

The first semiconductor layer may comprise a cladding layer of a first conductivity type, the active layer, and a first cladding layer of a second conductivity type in this order from its bottom, and the second semiconductor layer comprises a second cladding layer of a second conductivity type as the cladding layer.

When the refractive index of the current blocking layer is lower than the refractive indexes of the cladding layer of a first conductivity type and the first and second cladding layers of a second conductivity type, an effective refractive index in a region of the active layer under the second cladding layer is higher than an effective refractive index in a region of the active layer under the current blocking layer. Accordingly, light is concentrated on the region of the active layer under the second cladding layer. Consequently, a semiconductor laser device having a real refractive index guided structure in which the aspect ratio of emitted laser light is low is realized.

On the other hand, when the current blocking layer has a smaller band-gap than that of the active layer, light emitted in the active layer under the current blocking layer is absorbed by the current blocking layer. Accordingly, light is concentrated on the region of the active layer under the second cladding layer. Consequently, a semiconductor laser device having a loss guided structure in which the aspect ratio of emitted laser light is low is realized.

The first semiconductor layer may be a first nitride based semiconductor layer containing at least one of boron, thallium, gallium, aluminum, and indium, the second semiconductor layer may be a second nitride based semiconductor layer containing at least one of boron, thallium, gallium, aluminum, and indium, and the current blocking layer may be a third nitride based semiconductor layer containing at least one of boron, thallium, gallium, aluminum, and indium. In this case, a semiconductor laser device which emits light having a short wavelength is realized.

Particularly when the conductivity type of the second semiconductor layer is a p type, it is difficult to decrease the volume resistivity of the second semiconductor layer. In this case, the effect of reducing an operating voltage by increasing the width at the lower end of the upper layer in the cladding layer becomes significant.

A method of fabricating a semiconductor laser device according to another aspect of the present invention comprises the steps of forming a first semiconductor layer including an active layer; and forming a striped second semiconductor layer on the first semiconductor layer, and forming a current blocking layer on the first semiconductor layer on both sides of the second semiconductor layer, the step of forming the second semiconductor layer comprising the step of forming a cladding layer which comprises a lower layer having a first width at its lower end and an upper layer having a second width larger than the first width at its lower end and has a larger band-gap than that of the active layer.

In the semiconductor laser device fabricated by the fabricating method, the cladding layer comprises the lower layer having a first width at its lower end and the upper layer having a second width larger than the first width at its lower end. Accordingly, the resistance of the upper layer in the cladding layer is decreased. Consequently, an operating voltage is reduced.

The width at the lower end of the lower layer in the cladding layer is smaller than the width of the upper layer in the cladding layer. Accordingly, the width of a light emitting spot in a direction parallel to the active layer can be decreased. In this case, it is possible to decrease the aspect ratio of emitted laser light.

On the other hand, the width of a current injection region is defined by the width at the lower end of the lower layer in the cladding layer. When the width of the light emitting spot is defined by the width at the lower end of the upper layer in the cladding layer, therefore, the width of the current injection region is smaller than the width of the light emitting spot. In this case, both sides of the current injection region can function as a saturable light absorbing member, so that self-sustained pulsation occurs. As a result, low-noise characteristics can be obtained.

The step of forming the second semiconductor layer and the current blocking layer may comprise the step of forming a current blocking layer on the first semiconductor layer, the step of forming on the current blocking layer a first mask pattern having a first striped opening, the step of etching the current blocking layer inside the first striped opening of the first mask pattern by a first depth, to form a striped recess in the current blocking layer, the step of removing the first mask pattern, and then forming a second mask pattern having a second striped opening wider than the striped recess of the current blocking layer on the current blocking layer on both sides of the striped recess, the step of etching the current blocking layer inside the second striped opening of the second mask pattern to a second depth at which the first semiconductor layer is exposed, to form in the current blocking layer a striped opening which stepwise widens from a lower end to an upper end of the current blocking layer, and the step of removing the second mask pattern, and then forming the second semiconductor layer on the current blocking layer and on the first semiconductor layer inside the striped opening of the current blocking layer.

In this case, the current blocking layer is formed on the first semiconductor layer including the active layer, and the first mask pattern having the first striped opening is formed on the current blocking layer. The current blocking layer inside the first striped opening of the first mask pattern is etched by the first depth. At this time point, the first semiconductor layer has not been exposed yet, so that the striped recess is formed in the current blocking layer.

After the first mask pattern is removed, the second mask pattern having the second striped opening wider than the striped recess of the current blocking layer is formed on the current blocking layer on both sides of the striped recess. The current blocking layer inside the striped opening of the second mask pattern is etched to the second depth. Consequently, the first semiconductor layer is exposed in a region of the striped recess formed in the current blocking layer. Therefore, the striped opening which stepwise widens from its lower end to its upper end is formed in the current blocking layer. After the second mask pattern is removed, the second semiconductor layer is formed on the current blocking layer and on the first semiconductor layer inside the striped opening of the current blocking layer.

The cladding layer comprising the lower layer having the first width at its lower end and the upper layer having the second width larger than the first width at its lower end is thus formed.

The step of forming the second semiconductor layer and the current blocking layer comprises the step of forming a current blocking layer on the first semiconductor layer, the step of forming on the current blocking layer a first mask pattern having a first striped opening and composed of a first material, the step of forming a second mask pattern having a second striped opening narrower than the first striped opening of the first mask pattern and composed of a second material different from the first material on the current blocking layer inside the first striped opening and on the first mask pattern, the step of etching the current blocking layer inside the second striped opening of the second mask pattern by a first depth, to form a striped recess in the current blocking layer, the step of removing the second mask pattern, and then etching the current blocking layer inside the first striped opening of the first mask pattern to a second depth at which the first semiconductor layer is exposed, to form in the current blocking layer a striped opening which stepwise widens from a lower end to an upper end of the current blocking layer, and the step of removing the first mask pattern, and then forming the second semiconductor layer on the current blocking layer and on the first semiconductor layer inside the striped opening of the current blocking layer.

In this case, the current blocking layer is formed on the first semiconductor layer including the active layer, the first mask pattern having the first striped opening is formed on the current blocking layer, and the second mask pattern having the second striped opening narrower than the first striped opening of the first mask pattern is formed on the current blocking layer inside the first striped opening and on the first mask pattern. The current blocking layer inside the second striped opening of the second mask pattern is etched by only the first depth. At this time point, the first semiconductor layer has not been exposed yet, so that the striped recess is formed in the current blocking layer.

After the second mask pattern is removed, the current blocking layer inside the first striped opening of the first mask pattern is etched to the second depth. Consequently, the first semiconductor layer is exposed in a region of the striped recess formed in the current blocking layer. Therefore, the striped opening which stepwise widens from its lower end to its upper end is formed in the current blocking layer. After the first mask pattern is removed, the second semiconductor layer is formed on the current blocking layer and on the first semiconductor layer inside the striped opening of the current blocking layer.

The cladding layer comprising the lower layer having the first width at its lower end and the upper layer having the second width larger than the first width at its lower end is thus formed.

The step of forming the second semiconductor layer and the current blocking layer may comprise the step of forming a first current blocking layer on the first semiconductor layer, the step of forming on the first current blocking layer a first mask pattern having a first striped opening, the step of etching the first current blocking layer inside the first striped opening of the first mask pattern, to form a striped opening in the first current blocking layer, the step of removing the first mask pattern, and then forming a second semiconductor layer on the first current blocking layer and on the first semiconductor layer inside the striped opening of the first current blocking layer, the step of forming a striped second mask pattern in a region on the second semiconductor layer above the striped opening of the first current blocking layer, the step of etching the second semiconductor layer, except in a region of the second mask pattern to expose the first current blocking layer on both sides of the second mask pattern, to form in the second semiconductor layer a lower layer having the first width which is approximately constant from its lower end to its upper end and an upper layer having a width which gradually decreases upward from the second width, and the step of selectively forming a second current blocking layer on the first current blocking layer, except in a region on the second mask pattern.

In this case, the first current blocking layer is formed on the first semiconductor layer including the active layer, and the first mask pattern having the first striped opening is formed on the first current blocking layer. The first current blocking layer inside the first striped opening of the first mask pattern is etched, so that the striped opening is formed in the first current blocking layer. After the first mask pattern is removed, the second semiconductor layer is formed on the first current blocking layer and on the first semiconductor layer inside the striped opening of the first current blocking layer.

The striped second mask pattern is formed in a region on the second semiconductor layer above the striped opening of the first current blocking layer, and the second semiconductor layer, except in a region of the second mask pattern, is etched. Consequently, the first current blocking layer is exposed on both sides of the second mask pattern. In this case, the second mask pattern is formed in a region on the second semiconductor layer above the striped opening of the first current blocking layer. Accordingly, the second semiconductor layer remaining under the second mask pattern is overlapped with the striped opening of the first current blocking layer. The second semiconductor layer formed at this time comprises the lower layer having the first width which is approximately constant and the upper layer having the width which gradually decreases upward from the second width. The second current blocking layer is selectively formed on the first current blocking layer, except in a region on the second mask pattern.

The cladding layer comprising the lower layer having the first width at its lower end and the upper layer having the second width larger than the first width at its lower end is thus formed.

The step of forming the second semiconductor layer and the current blocking layer may comprise the step of forming on the first semiconductor layer a first mask pattern having a striped opening, the step of selectively growing a second semiconductor layer on the first semiconductor layer inside the striped opening and on the first mask pattern in the periphery of the striped opening, the step of removing the first mask pattern, and then forming a second mask pattern on an upper surface of the second semiconductor layer, and the step of selectively growing a current blocking layer on the first semiconductor layer on both sides of the second semiconductor layer, except on the second mask pattern.

In this case, the first mask pattern having the striped opening is formed on the first semiconductor layer, and the second semiconductor layer is selectively grown on the first semiconductor layer inside the striped opening and on the first mask pattern in the periphery of the striped opening. After the first mask pattern is removed, the second mask pattern is formed on the upper surface of the second semiconductor layer, and the current blocking layer is selectively grown on the first semiconductor layer on both sides of the second semiconductor layer, except on the second mask pattern.

The cladding layer comprising the lower layer having the first width at its lower end and the upper layer having the second width larger than the first width at its lower end is thus formed.

In this case, the cladding layer comprising the lower layer and the upper layer is formed by the selective growth, so that the crystallizability on a side surface of the cladding layer is improved. Consequently, the state of the interface of the cladding layer and the current blocking layer is improved, thereby reducing an invalid current flowing through the interface. As a result, device characteristics are improved.

The fabricating method may further comprise the step of forming on the cladding layer a third semiconductor layer having a smaller band-gap than that of the cladding layer. In this case, good ohmic contact can be obtained between the third semiconductor layer and an electrode.

The fabricating method may further comprise the step of forming on the cladding layer a third semiconductor layer having a carrier concentration which is not less than that of the cladding layer. In this case, the carrier concentration of the third semiconductor layer can be increased, so that good ohmic contact can be obtained between the third semiconductor layer and an electrode.

The step of forming the cladding layer may comprise the step of forming a lower layer having the first width which is approximately constant from its lower end to its upper end and an upper layer having the second width which is approximately constant from its lower end to its upper end.

In this case, a cladding layer having a reverse two-step shaped stripe structure comprising a lower end having a side surface approximately perpendicular to an active layer and an upper layer having a side surface approximately perpendicular to the active layer is obtained.

The step of forming the cladding layer may comprise the step of forming a lower layer having a first width which is approximately constant from its lower end to its upper end and an upper layer having a width which gradually decreases upward from the second width.

In this case, a cladding layer having a reverse two-step shaped stripe structure comprising a lower layer having a side surface approximately perpendicular to an active layer and an upper layer having a side surface inclined from the active layer is obtained. Particularly, the width at the upper end of the upper layer in the cladding layer can be increased by increasing the width at the lower end of the upper layer in the cladding layer. Consequently, the resistance of the upper layer in the cladding layer is decreased.

The step of forming the first semiconductor layer may comprise the step of forming a cladding layer of a first conductivity type, the active layer, and a first cladding layer of a second conductivity type in this order from its bottom, and the step of forming the second semiconductor layer may comprise the step of forming a second cladding layer of a second conductivity type as the cladding layer.

The first semiconductor layer may be a first nitride based semiconductor layer containing at least one of boron, thallium, gallium, aluminum, and indium, the second semiconductor layer may be a second nitride based semiconductor layer containing at least one of boron, thallium, gallium, aluminum, and indium, and the current blocking layer may be a third nitride based semiconductor layer containing at least one of boron, thallium, gallium, aluminum, and indium. In this case, a semiconductor laser device which emits light having a short wavelength is realized.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
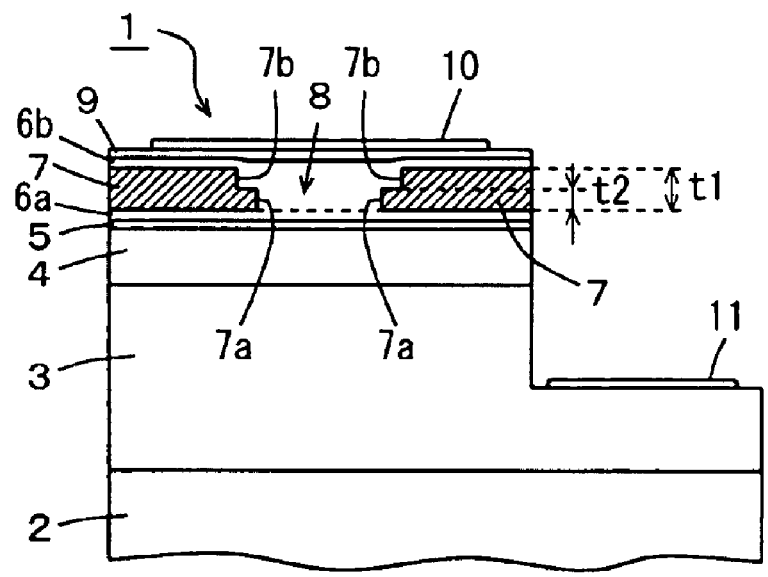
FIG. 1 is a schematic sectional view showing the construction of a GaN based semiconductor laser device in a first embodiment of the present invention.
Figure 2:
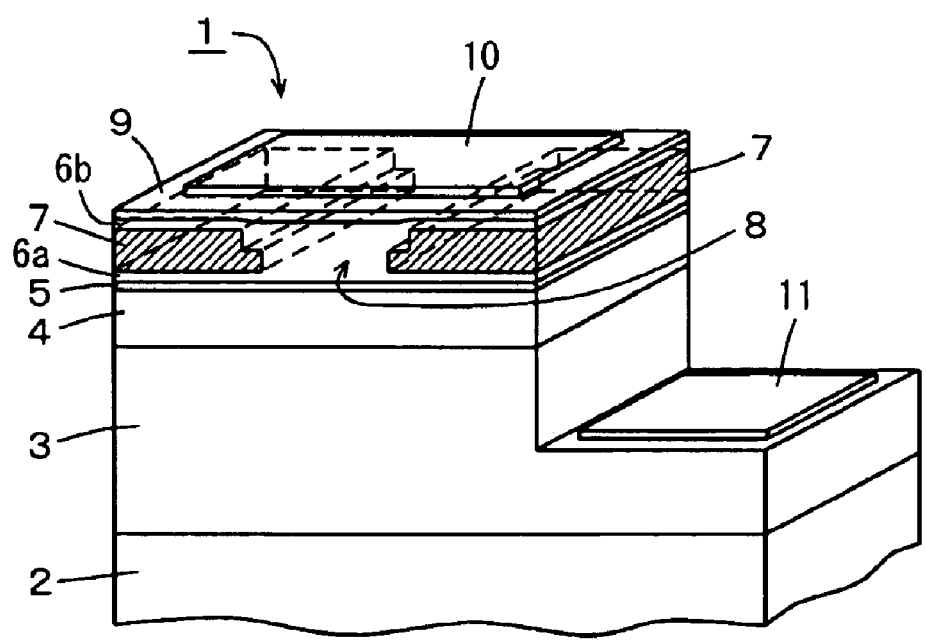
FIG. 2 is a schematic perspective view showing the construction of the semiconductor laser device shown in FIG. 1.

FIG. 1 is a schematic sectional view showing the construction of a GaN based semiconductor laser device in a first embodiment of the present invention. FIG. 2 is a schematic perspective view of the semiconductor laser device shown in FIG. 1. Description is now made of a semiconductor laser device having the construction shown in FIG. 1 and having a real refractive index guided structure.

In a semiconductor laser device 1 shown in FIG. 1, an n-contact layer 3 composed of n-GaN having a thickness of 4.5 $\mu$m, an n-cladding layer 4 composed of n-Al$_a$Ga$_{1-a}$N having a thickness of 1.0 $\mu$m, an MQW active layer 5, and a p-first cladding layer 6a composed of p-Al$_b$Ga$_{1-b}$N having a thickness of 0.1 $\mu$m are formed in this order on a sapphire substrate 2.

The MQW active layer 5 has a multi quantum well structure constructed by alternately stacking three quantum well layers composed of In$_x$Ga$_{1-x}$N having a thickness of 80

Å and four quantum barrier layers composed of $In_yGa_{1-y}N$ having a thickness of 160 Å, where x>y. In the present embodiment, x=0.13 and y=0.05.

An n-current blocking layer 7 composed of $n-Al_cGa_{1-c}N$ having a striped opening 8 is formed on the p-first cladding layer 6a. The striped opening 8 of the n-current blocking layer 7 has a step on both its inner side surfaces. That is, the upper width of the striped opening 8 of the n-current blocking layer 7 is gradually larger than the lower width thereof. A lower layer 7a in the n-current blocking layer 7 projects more inwardly, as compared with an upper layer 7b in the n-current blocking layer 7.

The thickness t1 of the whole of the n-current blocking layer 7 is 0.8 μm. The lower layer 7a in the n-current blocking layer 7 has a sufficient thickness t2 to block a current, which is not less than 0.5 μm in the present embodiment. A p-second cladding layer 6b having a thickness of 0.9 μm composed of $p-Al_dGa_{1-d}N$ and a p-contact layer 9 composed of p-GaN having a thickness of 0.05 μm are formed in this order on the n-current blocking layer 7 and on the p-first cladding layer 6a inside the striped opening 8. The p-first cladding layer 6a and the p-second cladding layer 6b are composed of the same material. Here, $0 \leq a<c, 0 \leq b<c$, and $0 \leq d<c$, and a=0.07, b=0.07, c=0.12, and d=0.07.

Si is used as an n-type dopant in each of the layers, and Mg is used as a p-type dopant in the layer.

A partial region from the p-contact layer 9 to the n-contact layer 3 is etched away, so that a surface of the n-contact layer 3 is exposed. A p electrode 10 is formed on the p-contact layer 9, and an n electrode 11 is formed on the exposed surface of the n-contact layer 3.

In the semiconductor laser device 1 according to the present embodiment, the Al composition ratio of the n-current blocking layer 7 is higher than the Al composition ratios of the p-first cladding layer 6a and the p-second cladding layer 6b. Accordingly, the refractive index of the n-current blocking layer 7 is lower than the refractive indexes of the p-first cladding layer 6a and the p-second cladding layer 6b. Consequently, an effective refractive index in a region of the MQW active layer 5 under the striped opening 8 is higher than an effective refractive index in a region of the MQW active layer 5 under the n-current blocking layer 7. Accordingly, light is concentrated on the region under the striped opening 8 between lower layers 7a in the n-current blocking layer 7. A semiconductor laser device 1 having a real refractive index guided structure in which an operating voltage is low and the width of a light emitting spot is small is thus realized.

Figure 3:
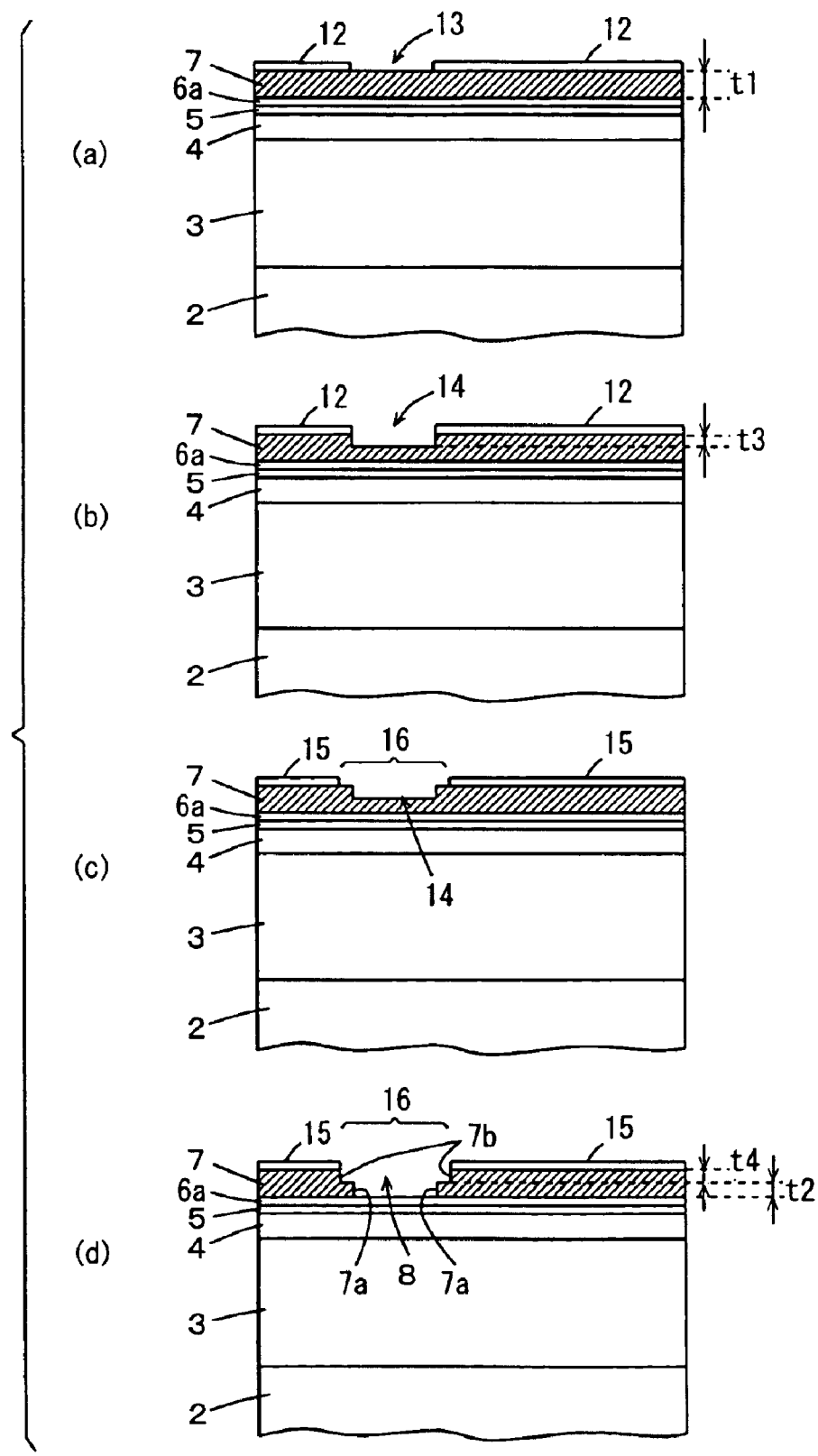
FIG. 3 is a schematic sectional view showing the steps of a first example of a method of fabricating the GaN based semiconductor laser device shown in FIG. 1.
Figure 4:
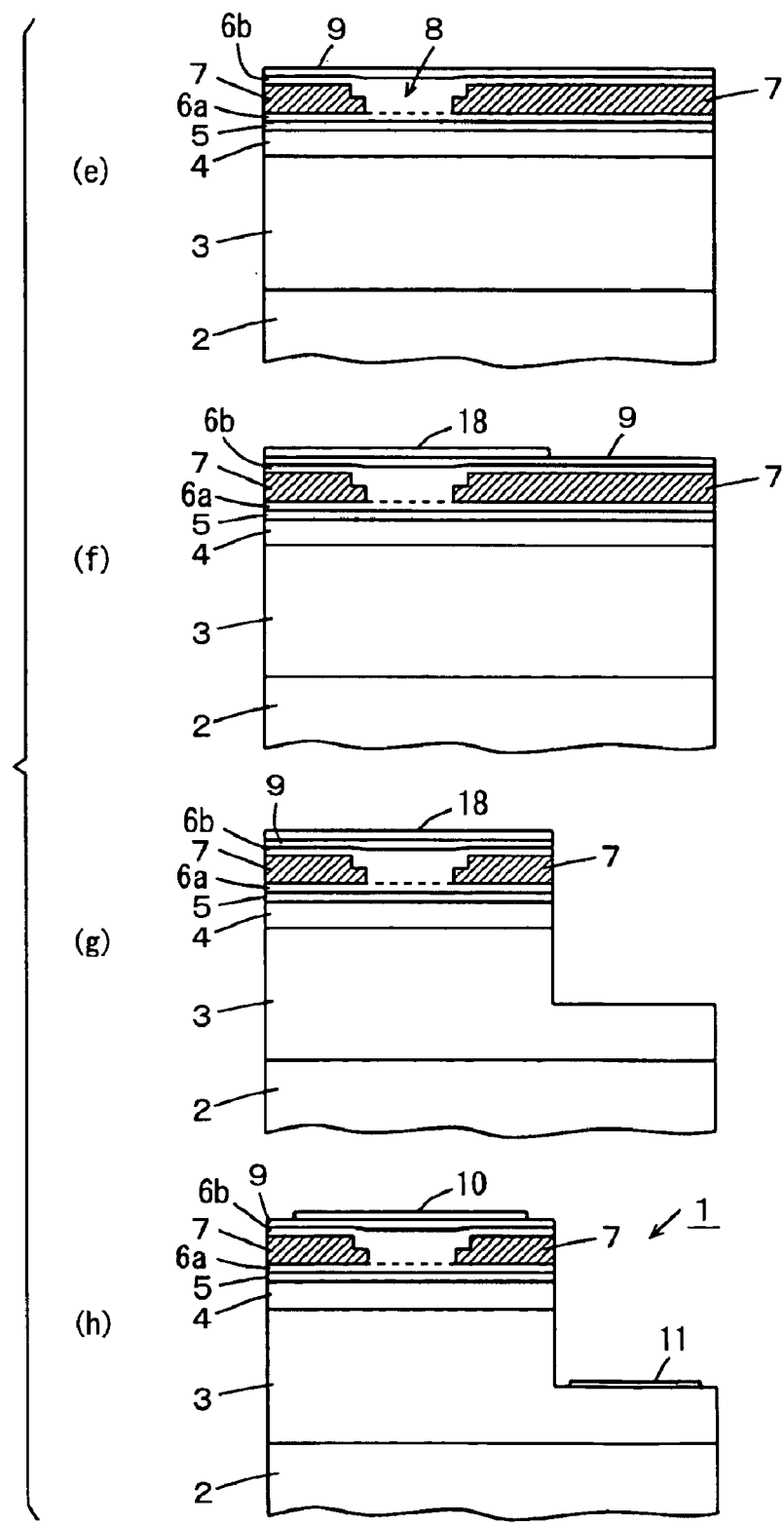
FIG. 4 is a schematic sectional view showing the steps of the first example of the method of fabricating the GaN based semiconductor laser device shown in FIG. 1.

FIGS. 3 and 4 are schematic sectional views showing the steps of a first example of a method of fabricating the GaN based semiconductor laser device 1 shown in FIG. 1.

As shown in FIG. 3(a), an n-contact layer 3, an n-cladding layer 4, an MQW active layer 5, a p-first cladding layer 6a, and an n-current blocking layer 7 are first continuously grown on a sapphire substrate 2 by MOCVD (Metal Organic Chemical Vapor Deposition) or the like. The thickness of the n-current blocking layer 7 is taken as t1. A first mask pattern 12 formed of an $SiO_2$ (silicon oxide) film, for example, having a first striped opening 13 is formed on the n-current blocking layer 7.

As shown in FIG. 3(b), the n-current blocking layer 7 inside the first striped opening 13 of the first mask pattern 12 is then removed by a first depth t3 by dry etching such as RIE (Reactive Ion Etching) or RIBE (Reactive Ion Beam Etching). Consequently, a striped recess 14 is formed in the n-current blocking layer 7. Thereafter, the first mask pattern 12 is removed.

As shown in FIG. 3(c), a second mask pattern 15 is then formed in a region on the n-current blocking layer 7 on both sides of the striped recess 14. In this case, the second mask pattern 15 has a second striped opening 16 which is wider than the striped recess 14, and is formed spaced a predetermined distance apart from an edge of the striped recess 14.

As shown in FIG. 3(d), the n-current blocking layer 7 inside the second striped opening 16 of the second mask pattern 15 is then removed by a second depth t4 by dry etching again. Consequently, the bottom of the striped recess 14 shown in FIG. 3(c) reaches the p-first cladding layer 6a, to expose the p-first cladding layer 6a. Accordingly, a striped opening 8 is formed in the n-current blocking layer 7. The second depth t4 at which the n-current blocking layer 7 is removed at this time is smaller than the depth of the n-current blocking layer 7. Accordingly, a step is formed in the striped opening 8, so that a lower layer 7a in the n-current blocking layer 7 projects more inwardly, as compared with an upper layer 7b in the n-current blocking layer 7. The thickness (t2=t1−t4) of the lower layer 7a is determined by the second depth t4 at which the n-current blocking layer 7 is etched away. The lower layer 7a has a sufficient thickness to block a current. Thereafter, the second mask pattern 15 is removed.

As shown in FIG. 4(e), a p-second cladding layer 6b and a p-contact layer 9 are then formed in this order on the p-first cladding layer 6a inside the striped opening 8 and on the n-current blocking layer 7.

Furthermore, as shown in FIG. 4(f), a third mask pattern 18 is formed in a predetermined region on the p-contact layer 9.

As shown in FIG. 4(g), a region from the p-contact layer 9 to the n-contact layer 3, except in a region of the third mask pattern 18, is removed by dry etching, to expose a surface of the n-contact layer 3. Thereafter, the third mask pattern 18 is removed.

Finally, as shown in FIG. 4(h), a p electrode 10 is formed on the p-contact layer 9, and an n electrode 11 is formed on the exposed surface of the n-contact layer 3.

Figure 5:
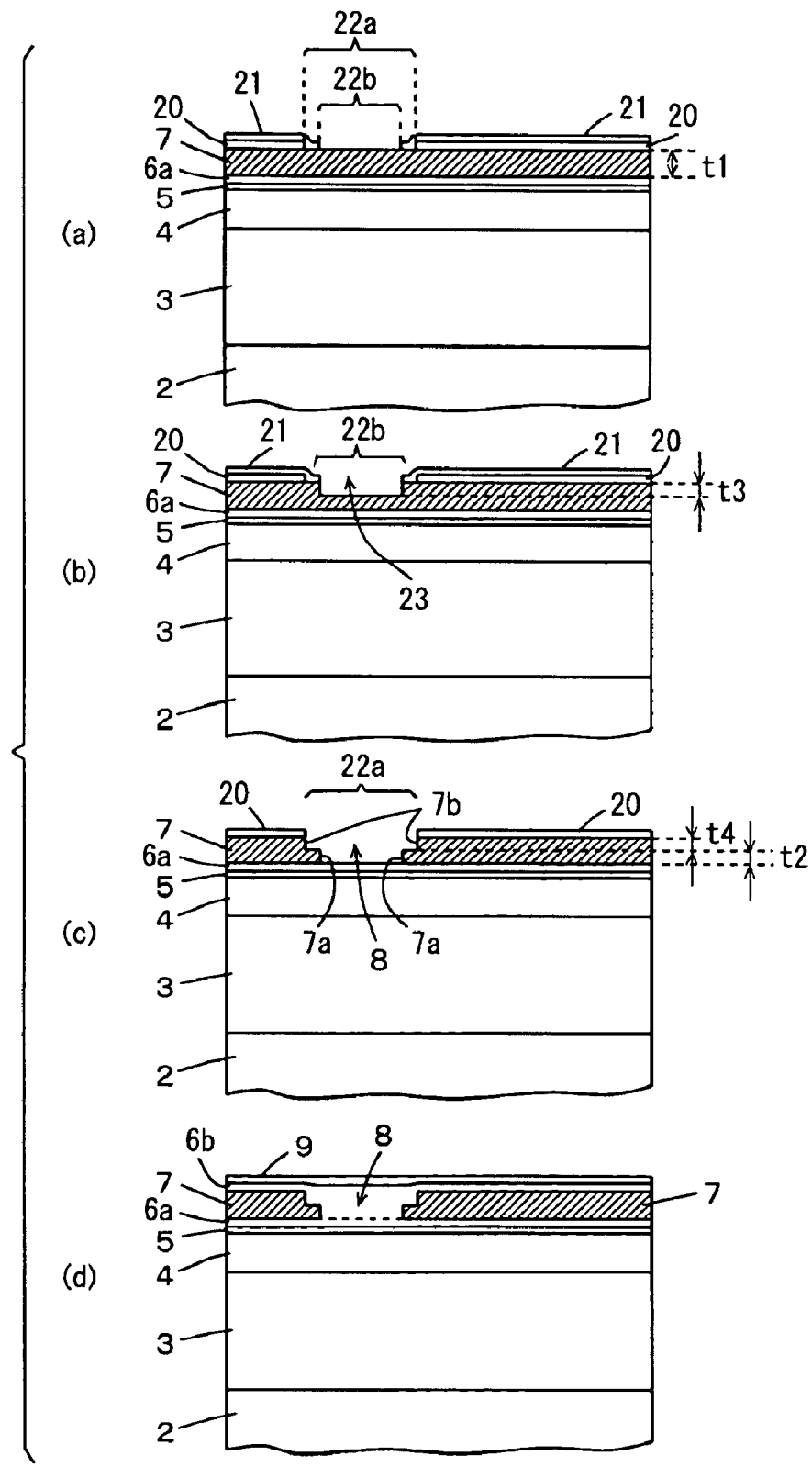
FIG. 5 is a schematic sectional view showing the steps of a second example of a method of fabricating the GaN based semiconductor laser device shown in FIG. 1.
Figure 6:
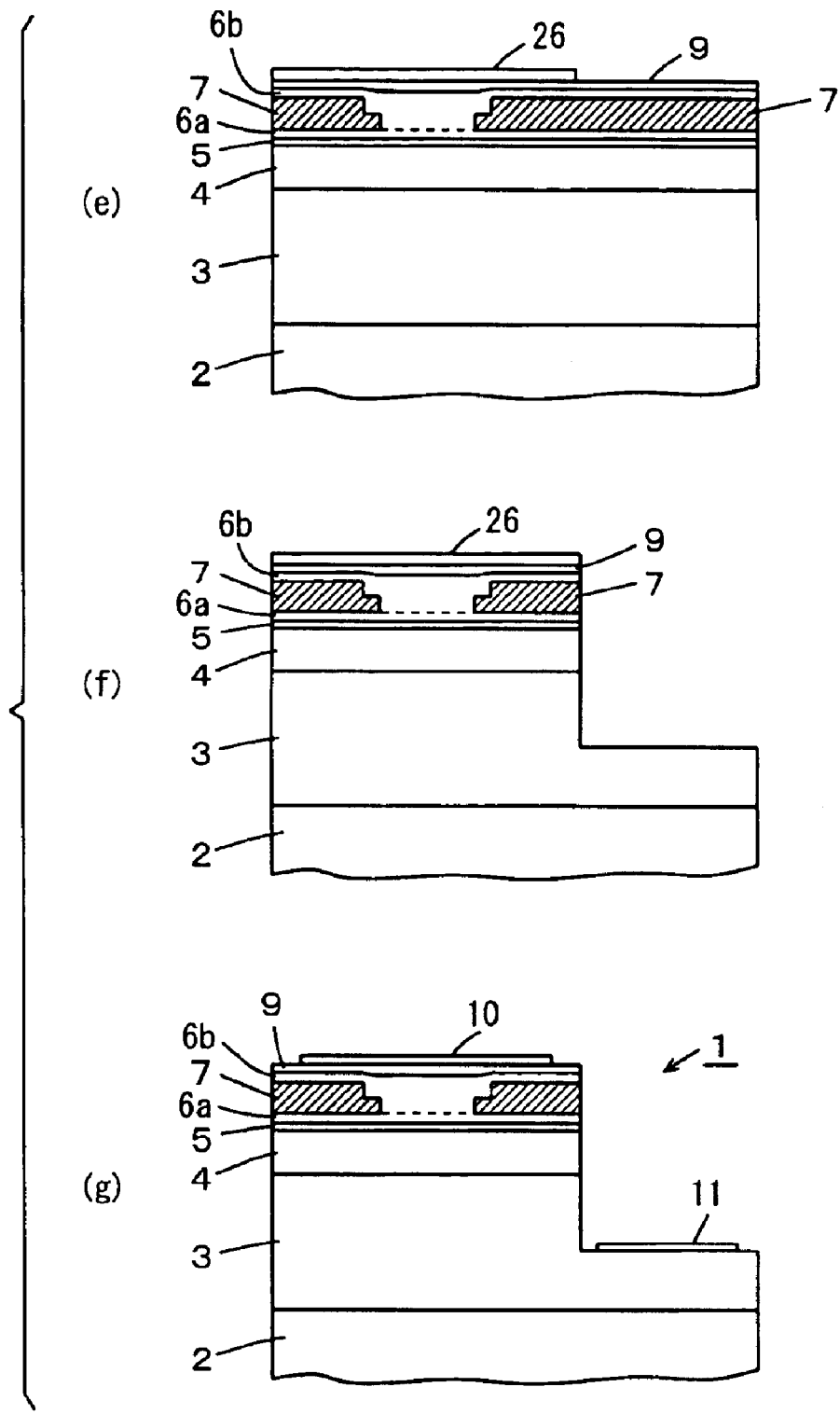
FIG. 6 is a schematic sectional view showing the steps of the second example of the method of fabricating the GaN based semiconductor laser device shown in FIG. 1.

FIGS. 5 and 6 are schematic sectional views showing the steps of a second example of a method of fabricating the GaN based semiconductor laser device 1 shown in FIG. 1.

As shown in FIG. 5(a), an n-contact layer 3, an n-cladding layer 4, an MQW active layer 5, a p-first cladding layer 6a, and an n-current blocking layer 7 are first continuously grown on a sapphire substrate 2 by MOCVD or the like. A first mask pattern 20 having a first striped opening 22a composed of $SiO_2$ (silicon oxide) is formed on the n-current blocking layer 7. Further, a second mask pattern 21 composed of Ni (nickel) having a second striped opening 22b is formed on the n-current blocking layer 7 inside the first striped opening 22a of the first mask pattern 20. The second mask pattern 21 is formed such that the second striped opening 22b is positioned inside of an edge of the first striped opening 22a and spaced a predetermined distance apart therefrom so as to cover the first mask pattern 20. The thickness of the current blocking layer 7 is taken as t1.

As shown in FIG. 5(b), the n-current blocking layer 7 inside the second striped opening 22b of the second mask pattern 21 composed of Ni is then removed by a first depth t3 by dry etching using $CCl_4$ (carbon tetrachloride). The first depth t3 is smaller than the thickness t1 of the n-current blocking layer 7, so that a striped recess 23 is formed in the n-current blocking layer 7.

Furthermore, as shown in FIG. 5(c), in the first striped opening 22a of the first mask pattern 20 composed of $SiO_2$, the n-current blocking layer 7 is removed by a second depth t4 by dry etching using $Cl_2$ (chlorine), to expose the p-first cladding layer 6a. Consequently, a striped opening 8 is formed in the n-current blocking layer 7. In this case, the second mask pattern 21 composed of Ni and the current blocking layer 7 under the second mask pattern 21 are etched. However, the first mask pattern 20 composed of $SiO_2$ is not etched. Accordingly, a distance between upper layers 7b in the n-current blocking layer 7 is equal to the width of the first striped opening 22a of the first mask pattern 20, and the second depth t4 is smaller than the thickness t1 of the n-current blocking layer 7. Accordingly, a distance between lower layers 7a having a thickness t2 in the n-current blocking layer 7 is decreased. Consequently, a striped opening 8 which stepwise widens from its lower end to its upper end is formed. Thereafter, the first mask pattern 20 is removed.

As shown in FIG. 5(d), a p-second cladding layer 6b and a p-contact layer 9 are then grown in this order on the n-current blocking layer 7 and on the p-first cladding layer 6a inside the striped opening 8.

Furthermore, as shown in FIG. 6(e), a third mask pattern 26 is formed in a predetermined region on the p-contact layer 9.

As shown in FIG. 6(f), a region from the p-contact layer 9 to the n-contact layer 3, except in a region of the third mask pattern 26, is removed by dry etching, to expose a surface of the n-contact layer 3. Thereafter, the third mask pattern 26 is removed.

Finally, as shown in FIG. 6(g), a p electrode 10 is formed on the p-contact layer 9, and an n electrode 11 is formed on the exposed surface of the n-contact layer 3.

Figure 7:
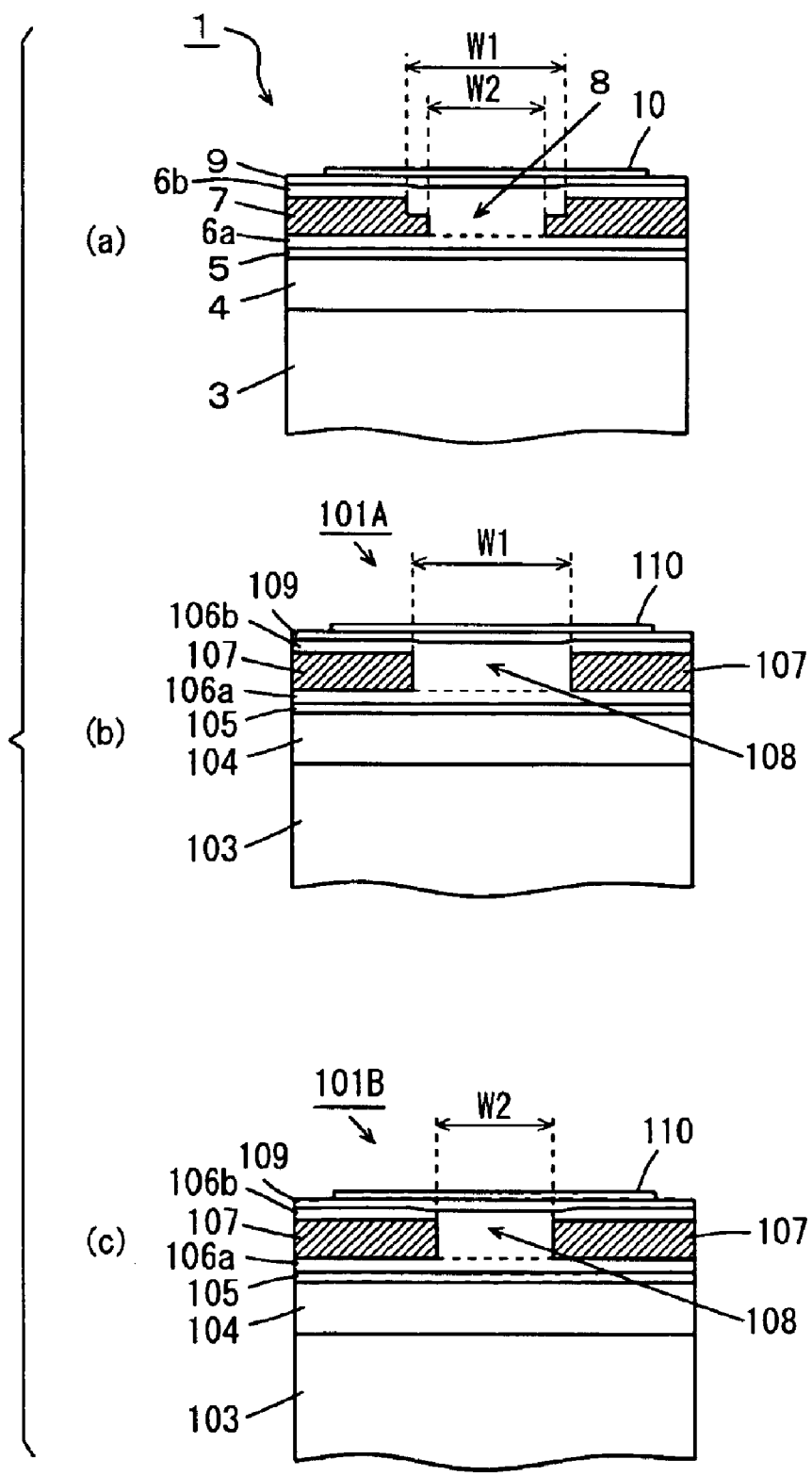
FIG. 7 is a diagram for explaining the effect of the GaN based semiconductor laser device in the first embodiment.

In the GaN based semiconductor laser device 1 according to the present embodiment, the width of the striped opening 8 of the current blocking layer 7 stepwise increases from W2 to W1, as shown in FIG. 7(a), for example, as the depth thereof decreases from its lower end to its upper end.

When the semiconductor laser device 1 according to the present embodiment shown in FIG. 7(a) and the conventional semiconductor laser device 101A shown in FIG. 7(b) are compared with each other, the width W1 at the upper end of the striped opening 8 in the semiconductor laser device 1 and the width W1 of the striped opening 108 in the semiconductor laser device 101A are the same. Accordingly, an operating voltage in the semiconductor laser device 1 and an operating voltage in the semiconductor laser device 101A are approximately the same. On the other hand, the width W2 at the lower end of the striped opening 8 in the semiconductor laser device 1 is smaller than the width W1 of the striped opening 108 in the semiconductor laser device 101A. Accordingly, the aspect ratio of laser light emitted by the semiconductor laser device 1 can be lower than the aspect ratio of laser light emitted by the semiconductor laser device 101A.

When the semiconductor laser device 1 according to the present embodiment shown in FIG. 7(a) and the conventional semiconductor laser device 101B shown in FIG. 7(c) are compared with each other, the width W2 at the lower end of the striped opening 8 in the semiconductor laser device 1 and the width W2 of the striped opening 108 in the semiconductor laser device 101B are the same. Accordingly, the aspect ratio of laser light emitted by the semiconductor laser device 1 and the aspect ratio of laser light emitted by the semiconductor laser device 101B are approximately the same. On the other hand, the width W1 at the upper end of the striped opening 8 in the semiconductor laser device 1 is larger than the width W2 of the striped opening 108 in the semiconductor laser device 101B. Accordingly, an operating voltage in the semiconductor laser device 1 can be made lower than an operating voltage in the semiconductor laser device 101B.

Figure 8:
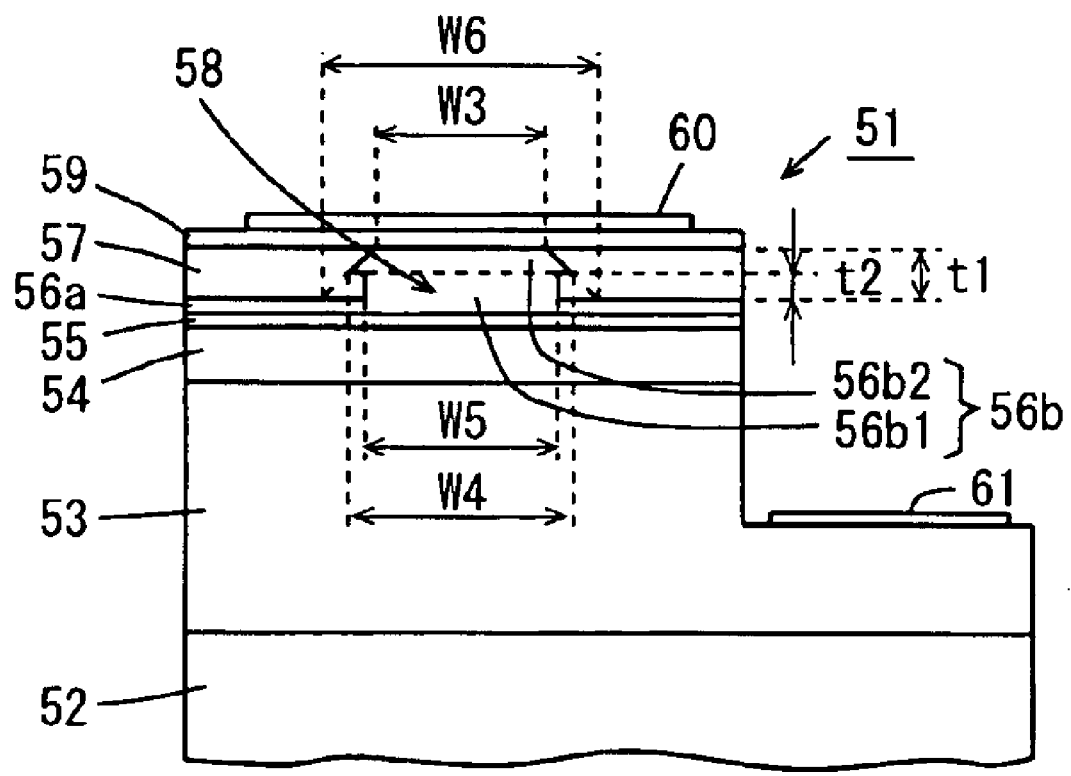
FIG. 8 is a schematic sectional view showing the construction of a GaN based semiconductor laser device in a second embodiment of the present invention.

FIG. 8 is a schematic sectional view showing the construction of a GaN based semiconductor laser device in a second embodiment of the present invention. Description is now made of a semiconductor laser device having a real refractive index guided structure as the semiconductor laser device in the second embodiment having the construction shown in FIG. 8.

In a semiconductor laser device 51 shown in FIG. 8, an n-contact layer 53 composed of n-GaN having a thickness of 4.5 μm, an n-cladding layer 54 composed of n-$Al_aGa_{1-a}N$ having a thickness of 1.0 μm, an MQW active layer 55, and a p-first cladding layer 56a composed of p-$Al_bGa_{1-b}N$ having a thickness of 0.1 μm are formed in this order on a sapphire substrate 52.

The MQW active layer 55 has a multi quantum well structure constructed by alternately stacking three quantum well layers composed of $In_xGa_{1-x}N$ having a thickness of 80 Å and four barrier layers composed of $In_yGa_{1-y}N$ having a thickness of 160 Å, where x>y. In the present embodiment, x=0.13 and y=0.05.

An n-current blocking layer 57 composed of n-$Al_cGa_{1-c}N$ having a striped opening 58 is formed on the p-first cladding layer 56a.

A p-second cladding layer 56b composed of p-$Al_cGa_{1-c}N$ having a thickness of 0.8 μm is formed on the p-first cladding layer 56a inside the striped opening 58. A p-contact layer 59 composed of p-GaN having a thickness of 0.05 μm is formed on the p-second cladding layer 56b and on the n-current blocking layer 57. Here, $0 \leq a < c$ and $0 \leq b < c$. In the present embodiment, a=0.07, b=0.07, and c=0.12.

The p-second cladding layer 56b comprises a lower layer 56b1 formed on the p-first cladding layer 56a and an upper layer 56b2 formed on the lower layer 56b1. The lower layer 56b1 is rectangular in cross section, has a height t2 which is not less than 0.5 μm, for example, and has an approximately constant width W5 of 3.5 μm. On the other hand, the upper layer 56b2 is trapezoidal in cross section, and has a height (t1-t2) of 0.3 μm, for example, where the length of its upper bottom is 3.5 μm, and its lower bottom is longer than the upper bottom. That is, the upper layer 56b2 has a width which gradually decreases upward from a width W4 (a second width) which is not less than the width W5 (a first width) of the lower layer 56b1.

Si is used as an n-type dopant in each of the layers, and Mg is used as a p-type dopant in the layer.

A partial region from the p-contact layer 59 to the n-contact layer 53 is etched away, so that a surface of the n-contact layer 53 is exposed. A p electrode 60 is formed on the p-contact layer 59, and an n electrode 61 is formed on the exposed surface of the n-contact layer 53.

In the semiconductor laser device 51 according to the present embodiment, the Al composition ratio of the n-current blocking layer 57 is higher than the Al composition ratios of the p-first cladding layer 56a and the p-second cladding layer 56b. Accordingly, the refractive index of the n-current blocking layer 57 is lower than the refractive indexes of the p-first cladding layer 56a and the p-second cladding layer 56b. Consequently, an effective refractive index in a region, of the MQW active layer 55, having the width W5, under the striped opening 58 is higher than an effective refractive index in a region of the MQW active layer 55 under the n-current blocking layer 57. Accordingly, light is concentrated on the region having the width W5 under the striped opening 58. A semiconductor laser device 51 having a real refractive index guided structure in which an operating voltage is low and the width of a light emitting spot is small is thus realized.

Figure 9:
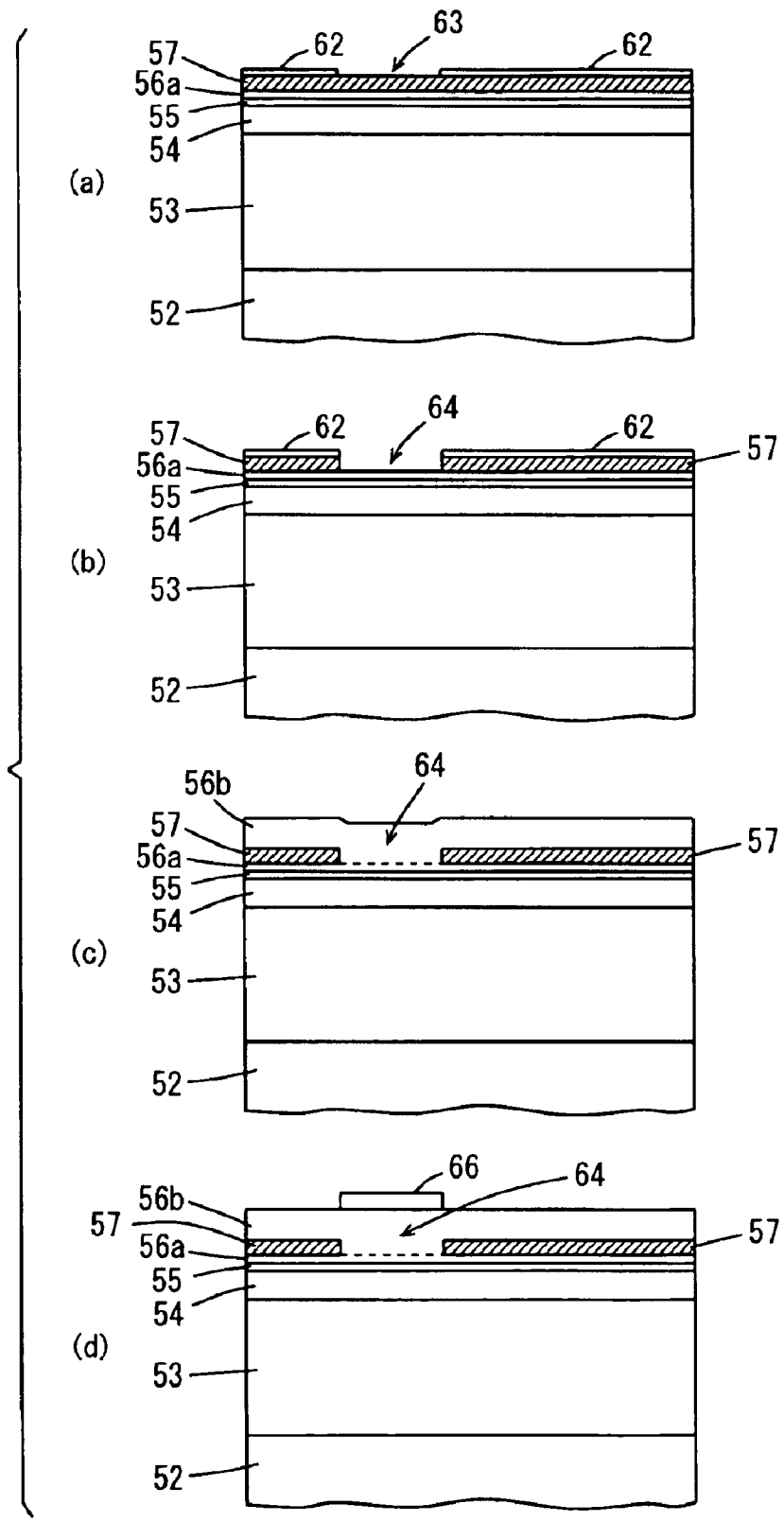
FIG. 9 is a schematic sectional view showing the steps of an example of a method of fabricating the GaN based semiconductor laser device shown in FIG. 8.
Figure 10:
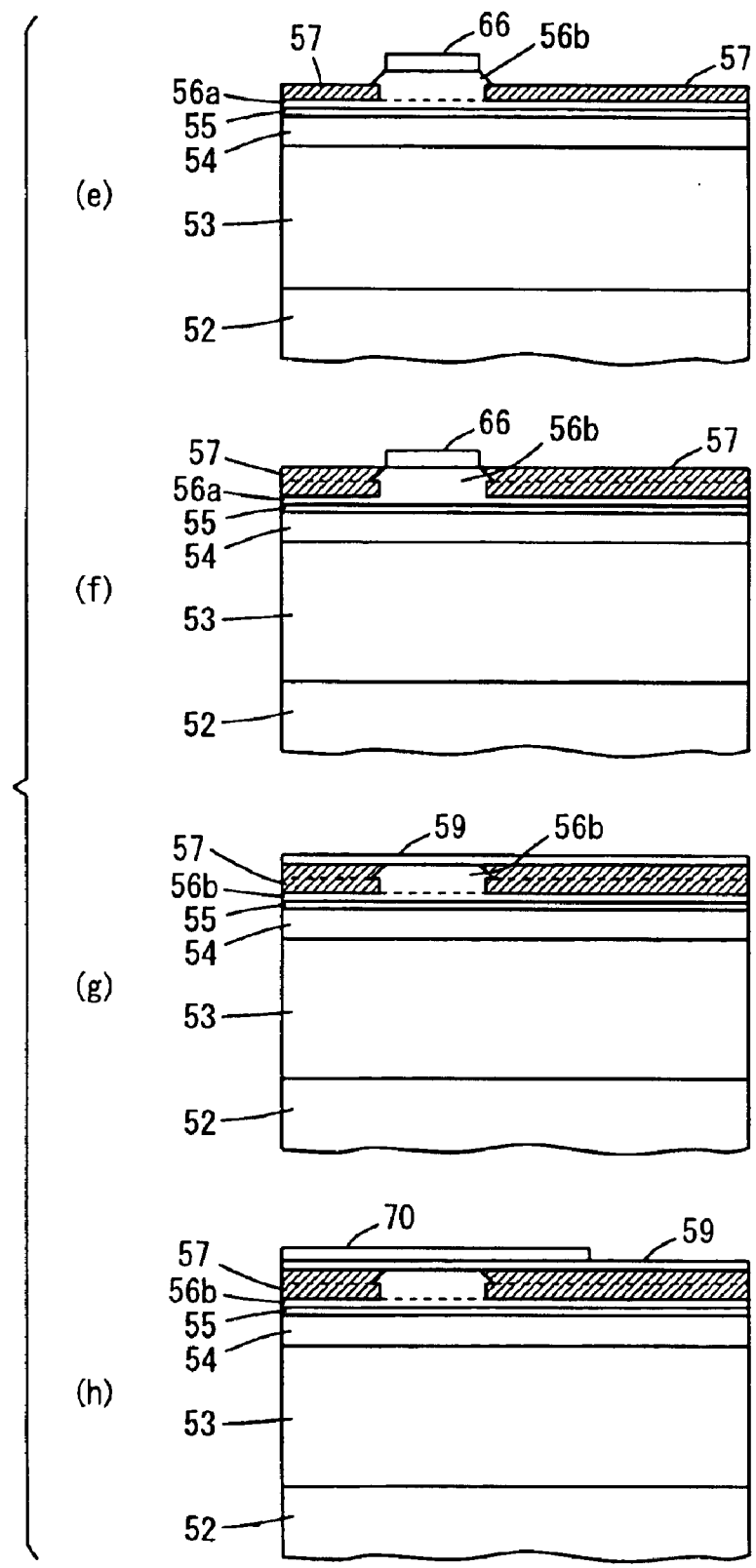
FIG. 10 is a schematic sectional view showing the steps of the example of the method of fabricating the GaN based semiconductor laser device shown in FIG. 8.
Figure 11:
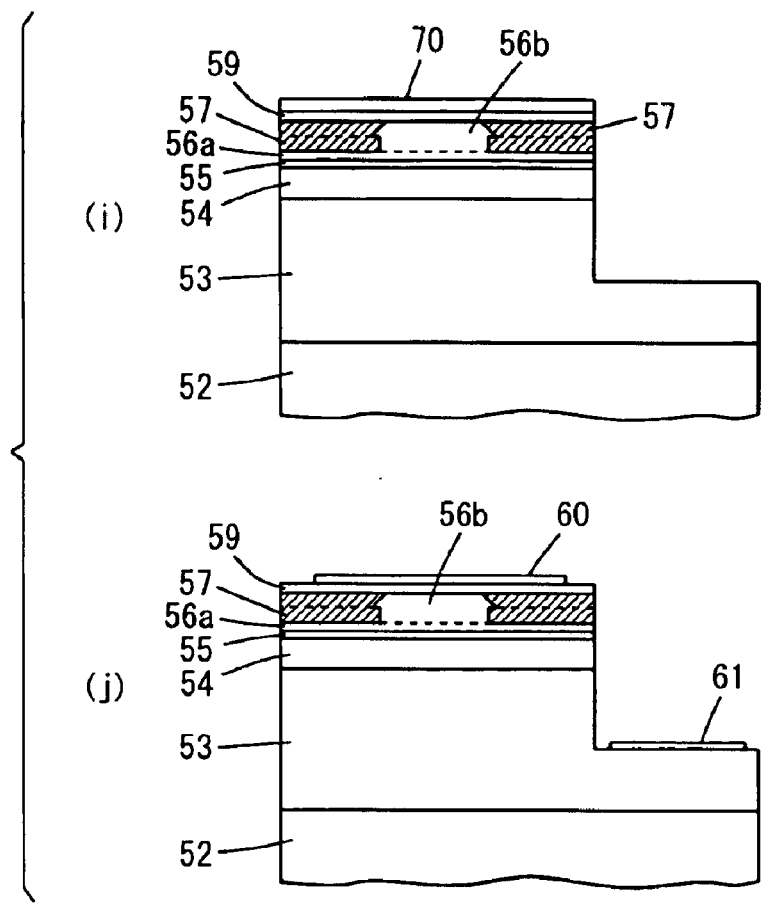
FIG. 11 is a schematic sectional view showing the steps of the example of the method of fabricating the GaN based semiconductor laser device shown in FIG. 8.

FIGS. 9, 10 and 11 are schematic sectional views showing the steps of an example of a method of fabricating the GaN based semiconductor laser device 51 shown in FIG. 8.

As shown in FIG. 9(a), an n-contact layer 53, an n-cladding layer 54, an MQW active layer 55, a p-first cladding layer 56a, and an n-current blocking layer 57 are first continuously grown on a sapphire substrate 52 by MOCVD or the like. A first mask pattern 62 having a first striped opening 63 is formed on the n-current blocking layer 57. In order to perform vertical etching in the subsequent steps. $SiO_2$ (silicon oxide), for example, which is not relatively difficult to etch is used for the first mask pattern 62.

As shown in FIG. 9(b), the n-current blocking layer 57 inside the first striped opening 63 of the first mask pattern 62 is then removed by dry etching such as RIBE (Reactive Ion Beam Etching) using $Cl_2$ (chlorine) or FIB (Focussed Ion Beam). Consequently, a striped opening 64 having an approximately vertical wall surface is then formed in the n-current blocking layer 57. Thereafter, the first mask pattern 62 is removed.

As shown in FIG. 9(c), a p-second cladding layer 56b is then grown on the p-first cladding layer 56a inside the striped opening 64 of the n-current blocking layer 57 and on the n-current blocking layer 57.

As shown in FIG. 9(d), a striped second mask pattern 66 is then formed of Ni (nickel) in a region on the p-second cladding layer 56b above the striped opening 64 of the n-current blocking layer 57.

As shown in FIG. 10(e), the p-second cladding layer 56b, except in a region of the striped second mask pattern 66, is then removed, to expose the n-current blocking layer 57. At this time, when RIE using $CCl_4$ (carbon tetrachloride), for example, is performed, a peripheral part of the second mask pattern 66 composed of Ni is gradually etched, to narrow. Accordingly, a facet of the p-second cladding layer 56b is obliquely etched.

Furthermore, as shown in FIG. 10(f), an n-current blocking layer 57 is selectively grown on the n-current blocking layer 57 and on a side surface of the p-second cladding layer 56b utilizing the striped second mask pattern 66 using the previous dry etching. The thickness of the n-current blocking layer 57 is made equal to the thickness of the p-second cladding layer 56b. A dotted line drawn in the n-current blocking layer 57 indicates the boundary between a lower n-first current blocking layer and an upper n-second current blocking layer.

As shown in FIG. 10(g), the striped second mask pattern 66 is then removed, and a p-contact layer 59 is then grown on the n-current blocking layer 57 and on the p-second cladding layer 56b.

As shown in FIG. 10(h), a third mask pattern 70 is formed in a predetermined region on the p-contact layer 59.

As shown in FIG. 11(i), a region from the p-contact layer 59 to the n-contact layer 53, except in a region of the third mask pattern 70, is then removed by dry etching, to expose a surface of the n-contact layer 53. Thereafter, the third mask pattern 70 is removed.

Finally, as shown in FIG. 11(h), a p electrode 60 is formed on the p-contact layer 59, and an n electrode 61 is formed on the exposed surface of the n-contact layer 53.

In the GaN based semiconductor laser device 51 according to the present embodiment, the p-second cladding layer 56b (a second semiconductor layer) comprises a lower layer 56b1 having an approximately constant width W5 (a first width) in the thickness direction and an upper layer 56b2 having a width which gradually decreases upward from a width W4 (a second width) which is not less than the width W5.

Therefore, the width W5 of the lower layer 56b1 in the p-second cladding layer 56b is smaller than a width W6 obtained at a lower end of the lower layer 56b1 upon gradually increasing downward from the width W4. Consequently, the width of a light emitting spot in a direction parallel to the active layer 55 is smaller, as compared with that in the conventional semiconductor laser device 201. Accordingly, the aspect ratio of emitted laser light can be reduced.

On the other hand, the width W3 of the upper layer 56b2 is increased irrespective of the width W5 of the lower layer 56b1, so that the widths W3 and W4 of the upper layer 56b2 can be increased. Accordingly, the resistance of the upper layer 56b2 can be decreased to decrease an operating voltage in the semiconductor laser device 51.

Although in the first and second embodiments, the insulating sapphire substrates 2 and 52 are used, the sapphire substrates 2 and 52 may be respectively replaced with conductive substrates such as GaN substrates or SiC substrates. In the case, a mask pattern forming process and a dry etching process are not carried out after the p-contact layers 9 and 59 are grown, to form the p electrodes 10 and 60 on the p-contact layers 9 and 59 and form the n electrodes 11 and 61 on the conductive substrates, for example, the GaN substrates.

Furthermore, the n-current blocking layers 7 and 57 may be respectively formed of materials having smaller bandgaps than those of the active layers 5 and 55. In this case, light emitted in the regions of the active layers 5 and 55 under the n-current blocking layers 7 and 57 is absorbed by the n-current blocking layers 7 and 57. Accordingly, the light is concentrated on the active layers 5 and 55 respectively having the widths W2 and W5 under the striped openings 8 and 58 of the p-first cladding layers 6a and 56a. Consequently, a semiconductor laser device having a loss guided structure is realized.

Also in this case, the insulating sapphire substrates 2 and 52 may be respectively replaced with conductive substrates such as GaN substrates or SiC substrates, to form the n electrodes 11 and 61 on the conductive substrates, for example, the GaN substrates, as in the semiconductor laser device having a real refractive index guided structure.

Although in the first and second embodiments, description was made of a case where the first cladding layers 6a and 56a and the second cladding layers 6b and 56b have the same composition, they may have different compositions.

Figure 12:
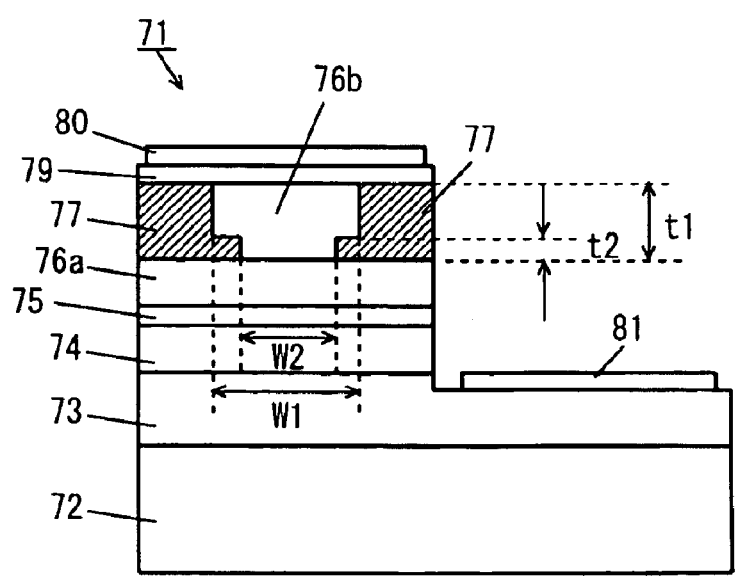
FIG. 12 is a schematic sectional view showing the construction of a GaN based semiconductor laser device in a third embodiment of the present invention.

FIG. 12 is a schematic sectional view showing the construction of a GaN based semiconductor laser device in a third embodiment of the present invention. Description is now made of a semiconductor laser device having the construction shown in FIG. 12 and having a real refractive index guided structure.

In a semiconductor laser device 71 shown in FIG. 12, an n-contact layer 73 composed of n-GaN having a thickness of 4.5 $\mu$m, an n-cladding layer 74 composed of n-$Al_aGa_{1-a}N$ having a thickness of 1.0 $\mu$m, an MQW active layer 75, and a p-first cladding layer 76a composed of p-$Al_bGa_{1-b}N$ having a thickness of 0.15 $\mu$m are formed in this order on a sapphire substrate 72.

The MQW active layer 75 has a multi quantum well structure constructed by alternately stacking three quantum well layers composed of $In_xGa_{1-x}N$ having a thickness of 80 Å and four quantum barrier layers composed of $In_yGa_{1-y}N$ having a thickness of 160 Å, where x>y. In the present embodiment, x=0.13 and y=0.05.

An n-current blocking layer 77 having a thickness of 0.3 μm composed of $n-Al_cGa_{1-c}N$ having a striped opening is formed on the p-first cladding layer 76a. The striped opening of the n-current blocking layer 77 has a step on both its inner side surfaces. That is, the upper width of the striped opening of the n-current blocking layer 77 is stepwise larger than the lower width thereof.

The thickness t1 of the whole of the n-current blocking layer 77 is 0.3 μm. A lower layer 77a in the n-current blocking layer 77 has a sufficient thickness t2 to block a current, which is 0.1 μm in the present embodiment.

A p-second cladding layer 76b having a thickness of 0.3 μm composed of $p-Al_dGa_{1-d}N$ is formed on the p-first cladding layer 76a inside the striped opening of the n-current blocking layer 77. The width W2 of a lower layer in the p-second cladding layer 76b is 2 μm, and the width W1 of an upper layer in the p-second cladding layer 76b is 2.5 μm. A p-contact layer 79 having a thickness of 0.1 μm composed of p-GaN is formed on the p-second cladding layer 76b and on the current blocking layer 77.

The p-first cladding layer 76a and the p-second cladding layer 76b are composed of the same material. Here, $0 \leq a<c$, $0 \leq b<c$, and $0 \leq d<c$, and a=0.07, b=0.07, c=0.12, and d=0.07.

Si is used as an n-type dopant in each of the layers, and Mg is used as a p-type dopant in the layer. The carrier concentrations of the p-first cladding layer 76a and the p-second cladding layer 76b are $1 \times 10^{17}$~$3 \times 10^{17}/cm^3$, and the carrier concentration of the p-contact layer 79 is $4 \times 10^{17}$~$8 \times 10^{17}/cm^3$.

A partial region from the p-contact layer 79 to the n-contact layer 73 is etched away, so that a surface of the n-contact layer 73 is exposed. A p electrode 80 is formed on the p-contact layer 79, and an n electrode 81 is formed on the exposed surface of the n-contact layer 73.

In the semiconductor laser device 71 according to the present embodiment, the Al composition ratio of the n-current blocking layer 77 is higher than the Al composition ratios of the p-first cladding layer 76a and the p-second cladding layer 76b. Accordingly, the refractive index of the n-current blocking layer 77 is lower than the respective refractive indexes of the p-first cladding layer 76a and the p-second cladding layer 76b. Consequently, an effective refractive index in a region of the MQW active layer 75 under the p-second cladding layer 76b is higher than an effective refractive index in a region of the MQW active layer 75 under the n-current blocking layer 77. Accordingly, light is concentrated on the region of the MQW active layer 75 under the p-second cladding layer 76b. A semiconductor laser device 71 having a real refractive index guided structure is thus realized.

Figure 13:
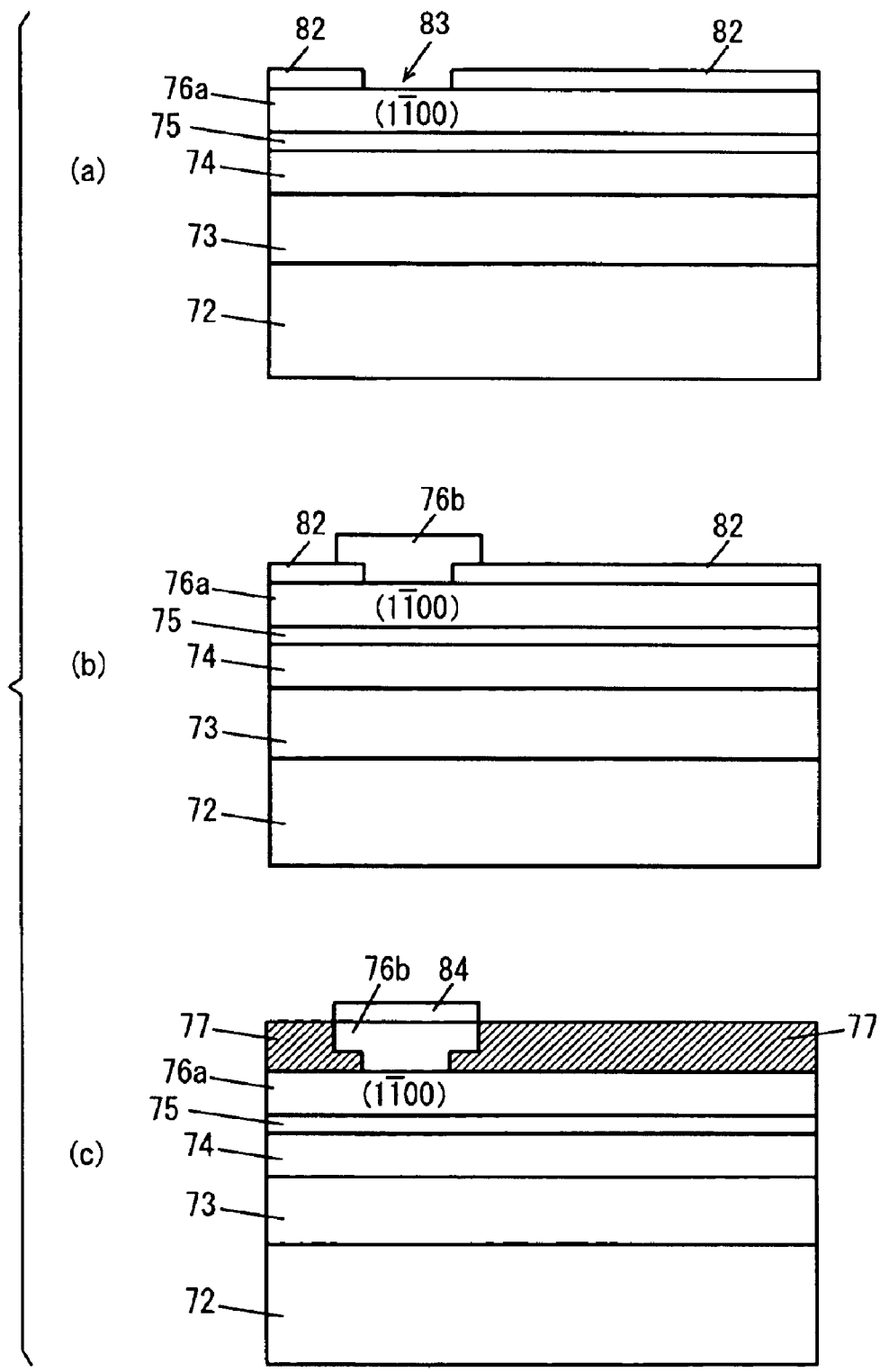
FIG. 13 is a schematic sectional view showing the steps of an example of a method of fabricating the GaN based semiconductor laser device shown in FIG. 12.
Figure 14:
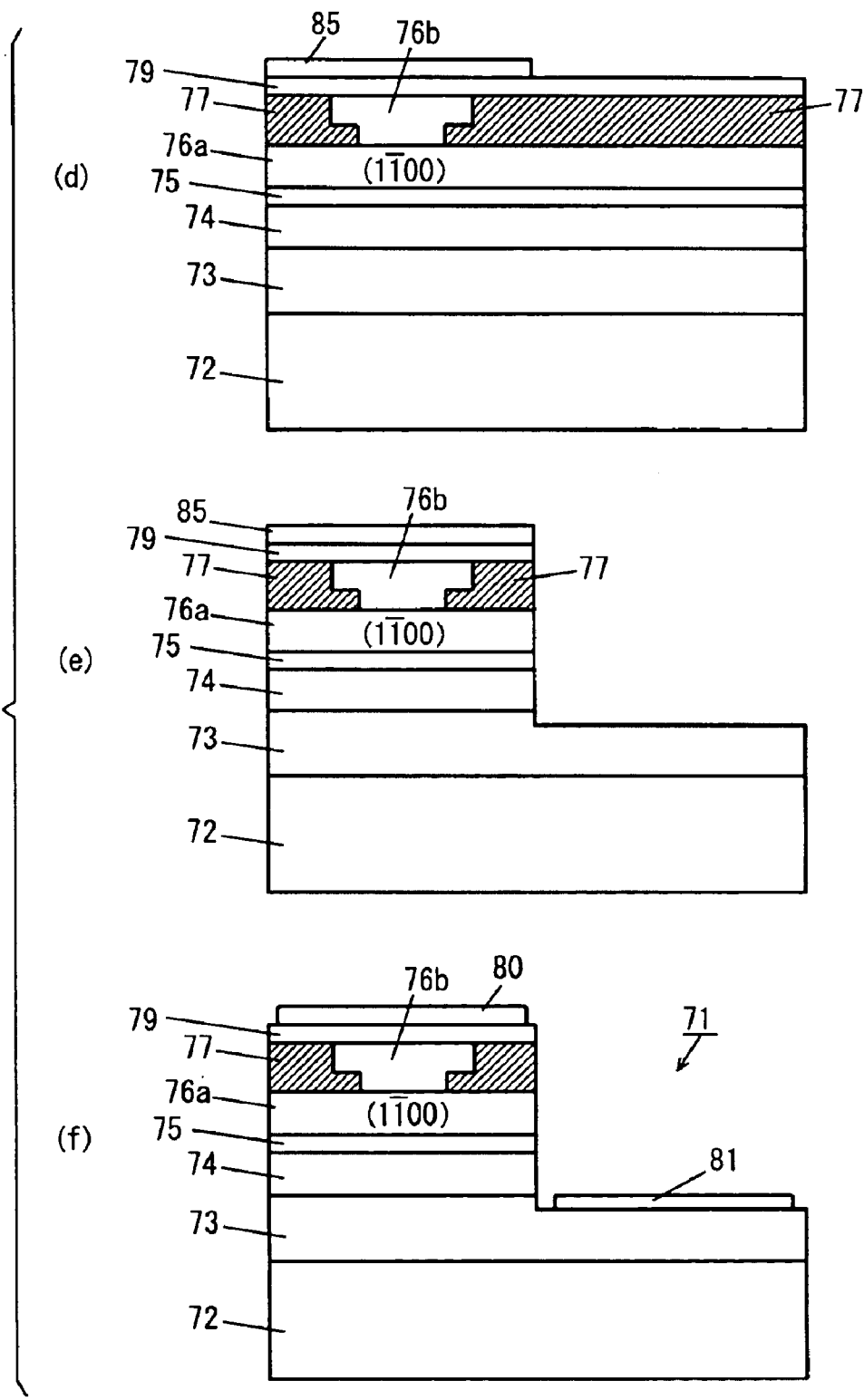
FIG. 14 is a schematic sectional view showing the steps of the method of fabricating the GaN based semiconductor laser device shown in FIG. 12.

FIGS. 13 and 14 are schematic sectional views showing the steps of an example of a method of fabricating the GaN based semiconductor laser device 71 shown in FIG. 12.

As shown in FIG. 13(a), an n-contact layer 73, an n-cladding layer 74, an MQW active layer 75, and a p-first cladding layer 76a are first continuously grown on a sapphire substrate 72 by MOCVD or the like in a crystal growing device. The sapphire substrate 72 on which the above-mentioned layers 73, 74, 75 and 76a have been formed is taken out of the crystal growing device, to form on the p-first cladding layer 76a a first mask pattern 82 composed of $SiO_2$ (silicon oxide), for example, having a striped opening 83 along a <1$\bar{1}$00> direction of the p-first cladding layer 76a.

As shown in FIG. 13(b), the sapphire substrate 72 is then returned to the crystal growing device, to grow a p-second cladding layer 76b. In this case, the substrate temperature is maintained at approximately 1000° C., thereby selectively growing the p-second cladding layer 76b only on the p-first cladding layer 76a inside the striped opening 83 and on the first mask pattern 82 in the periphery of the striped opening 83. As a result, the p-second cladding layer 76b has a structure having a step, that is, a reverse two-step shaped stripe structure in which the width of an upper layer (a layer far from the MQW active layer 75) is larger than the width of a lower layer (a layer close to the MQW active layer 75). In this case, a side surface of the upper layer in the p-second cladding layer 76b is approximately perpendicular to the MQW active layer 75.

The sapphire substrate 72 is taken out of the crystal growing device again, to chemically remove the first mask pattern 82 by hydrofluoric acid, for example. Thereafter, as shown in FIG. 13(c), a second mask pattern 84 composed of $SiO_2$, for example, is formed on an upper surface in the p-second cladding layer 76b. The sapphire substrate 72 is then returned to the crystal growing device, to grow an n-current blocking layer 77. In this case, the substrate temperature is maintained at approximately 1000° C. thereby selectively growing the n-current blocking layer 77 only on the p-first cladding layer 76a exposed, except in a region on the second mask pattern 84 formed on the n-second cladding layer 76b.

Thereafter, the sapphire substrate 72 is taken out of the crystal growing device, to remove the second mask pattern 84. The sapphire substrate 72 is then returned to the crystal growing device, to grow a p-contact layer 79 on the p-second cladding layer 76b and on the n-current blocking layer 77, as shown in FIG. 14(d). Further, the sapphire substrate 72 is taken out of the crystal growing device, to form a striped third mask pattern 85 composed of $SiO_2$, for example, on the p-contact layer 79. The third mask pattern 85 is arranged so as to cover a region above the p-second cladding layer 76b.

As shown in FIG. 14(e), a region from the p-contact layer 79 to the n-contact layer 73, except in a region of the third mask pattern 85, is removed by dry etching, to expose a surface of the n-contact layer 73. Thereafter, the third mask pattern 85 is removed.

Finally, as shown in FIG. 14(f), a p electrode 80 is formed on the p-contact layer 79, and an n electrode 81 is formed on the exposed surface of the n-contact layer 73.

According to the fabricating method shown in FIGS. 13 and 14, the striped p-second cladding layer 76b is formed by selective growth, so that the crystallizability on the side surface of the p-second cladding layer 76b is improved. Consequently, the state of the interface of the p-second cladding layer 76b and the n-current blocking layer 77 is improved, thereby making it possible to reduce an invalid current flowing through the interface. As a result, device characteristics are improved.

In the GaN based semiconductor laser device 71 according to the present embodiment, the width W1 at an upper end of the n-current blocking layer 77 is larger than the width W2 at a lower end thereof. That is, the width W1 at an upper end of the p-second cladding layer 76b is larger than the width W2 at a lower end thereof. Consequently, the resistance of the upper layer in the p-second cladding layer 76b is decreased. Accordingly, an operating voltage in the semiconductor laser device 71 is reduced.

Figure 15:
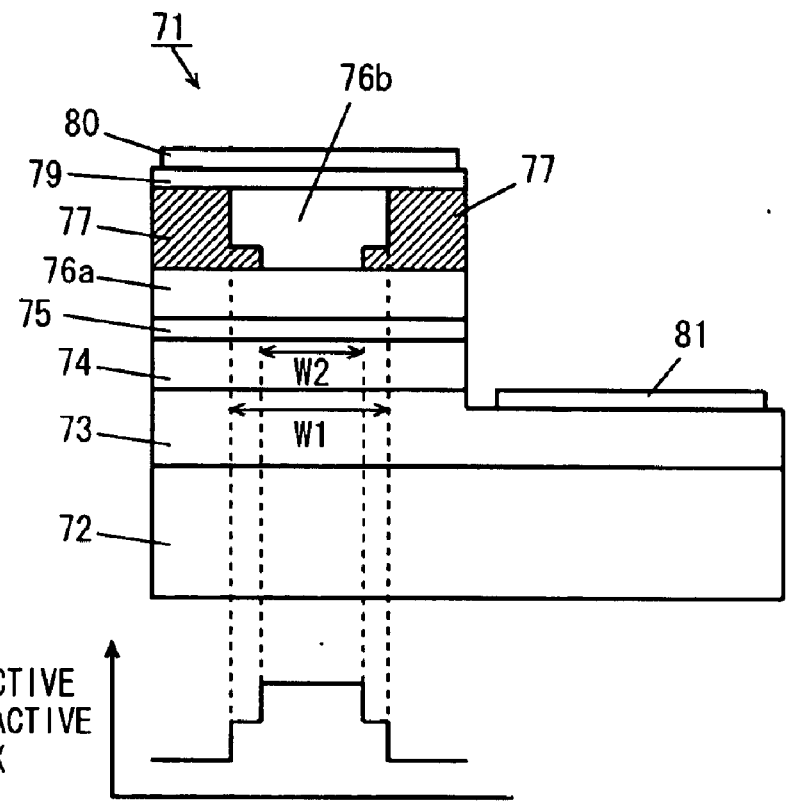
FIG. 15 is a diagram showing an effective refractive index distribution in an MQW active layer in the GaN based semiconductor laser device shown in FIG. 12.

FIG. 15 is a diagram showing an effective refractive index distribution in the MQW active layer 75 in the semiconductor laser device 71 shown in FIG. 12.

As shown in FIG. 15, the width W1 of the upper layer in the p-second cladding layer 76b is larger than the width W2 of the lower layer in the p-second cladding layer 76b. Accordingly, an effective refractive index is the highest in a region having the width W2 at the center of the MQW active layer 75, takes an intermediate value in a region having the width W1 larger than the width W2 of the MQW active layer 75, and is the lowest on both sides of the region having the width W1 of the MQW active layer 75. The effective refractive index distribution in the MQW active layer 75 thus has a stepped shape.

In this case, the width of a light emitting spot is W1, and the width of a current injection region is W2. Consequently, both sides of the current injection region function as a saturable light absorbing member, so that self-sustained pulsation occurs. As a result, a semiconductor laser device 71 having low-noise characteristics is realized.

Figure 16:
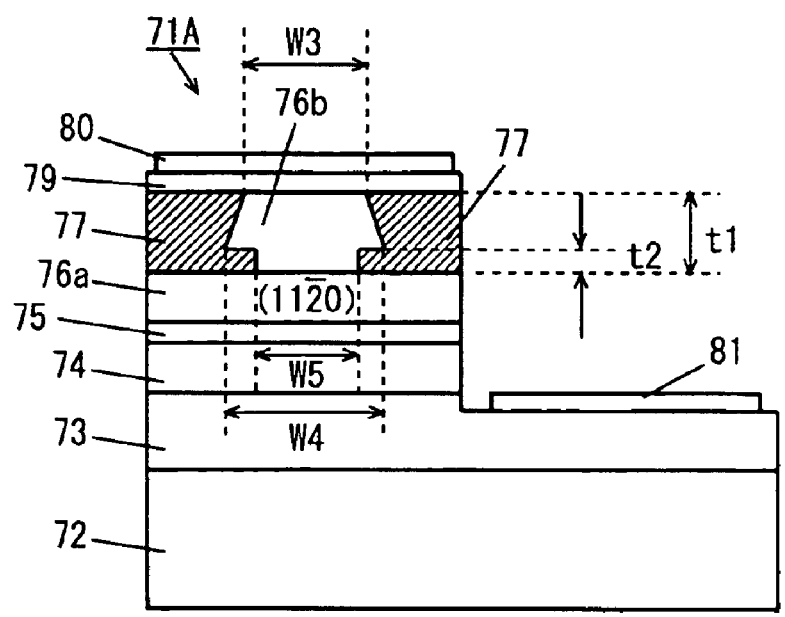
FIG. 16 is a schematic sectional view showing the construction of a GaN based semiconductor laser device in a fourth embodiment of the present invention.

FIG. 16 is a schematic sectional view showing the construction of a GaN based semiconductor laser device in a fourth embodiment of the present invention.

In a semiconductor laser device 71A shown in FIG. 16, a p-second cladding layer 76b comprises a lower layer having an approximately constant width W5 in the thickness direction and an upper layer having a width which gradually decreases upward from a width W4 larger than the width W5.

The width W5 of the lower layer in the p-second cladding layer 76b is 2 μm, and the width W4 at a lower end of the upper layer in the p-second cladding layer 76b is 2.5 μm. Further, the width W3 at an upper end of the upper layer in the p-second cladding layer 76b is 2.3 μm. The construction of the other portions of the semiconductor laser device 71A shown in FIG. 16 is the same as the construction of the semiconductor laser device 71 shown in FIG. 12.

In the GaN based semiconductor laser device 71A according to the present embodiment, the width W3 at the upper end of the upper layer in the p-second cladding layer 76b can be also increased by increasing the width W4 at the lower end of the upper layer in the p-second cladding layer 76b. Consequently, the resistance of the upper layer in the p-second cladding layer 76b is decreased. Accordingly, an operating voltage in the semiconductor laser device 71A is reduced.

The width W4 at the lower end of the upper layer in the p-second cladding layer 76b is larger than the width W5 at the lower end of the lower layer in the p-second cladding layer 76b. Accordingly, an effective refractive index is the highest in a region having the width W5 at the center of an MQW active layer 75, takes an intermediate value in a region having the width W4 larger than the width W5 of the MQW active layer 75, and is the lowest on both sides of the region having the width W4 of the MQW active layer 75.

In this case, the width of a light emitting spot is W4, and the width of a current injection region is W5. Consequently, both sides of the current injection region function as a saturable light absorbing member, so that self-sustained pulsation occurs. As a result, a semiconductor laser device 71A having low-noise characteristics is realized.

In fabricating the semiconductor laser device 71A according to the present embodiment, the striped opening 83 of the first mask pattern 82 is formed along a <11$\bar{2}$0> direction of the p-second cladding layer 76a at the step shown in FIG. 13(a), whereby both side surfaces of the p-second cladding layer 76b can be inclined by approximately 62° to the MQW active layer 75 at the step shown in FIG. 13(b). The other steps of fabricating the semiconductor laser device 71A shown in FIG. 16 are the same as those shown in FIGS. 13 and 14.

FIGS. 17, 18, 19, 20, and 21 are diagrams showing examples of band-gap energies in a cladding layer of a first conductivity type, an active layer, a cladding layer of a second conductivity type, and a contact layer of a second conductivity type in the semiconductor laser device according to the present invention.

Figure 17:
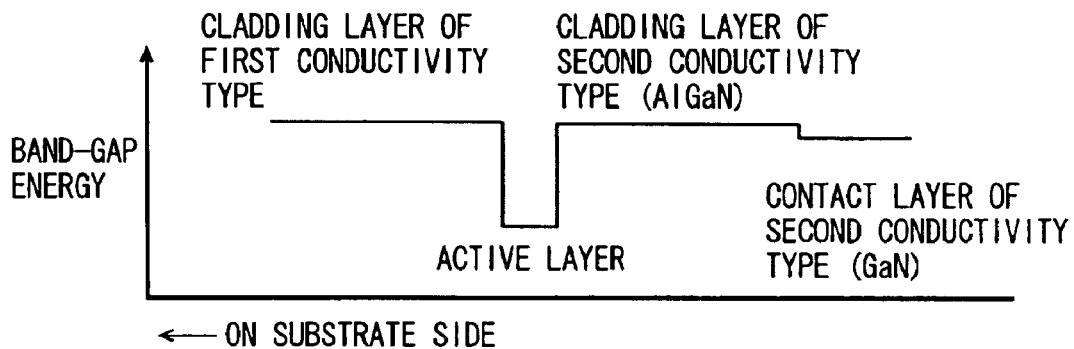
FIG. 17 is a diagram showing a first example of band-gap energies in a cladding layer of a first conductivity type, an active layer, a cladding layer of a second conductivity type, and a contact layer of a second conductivity type in the semiconductor laser device according to the present invention.

In the example shown in FIG. 17, the band-gap of the cladding layer of a second conductivity type composed of AlGaN is larger than the band-gap of the active layer and the band-gap of the contact layer of a second conductivity type composed of GaN, and the band-gap of the contact layer of a second conductivity type is larger than the band-gap of the active layer.

Figure 18:
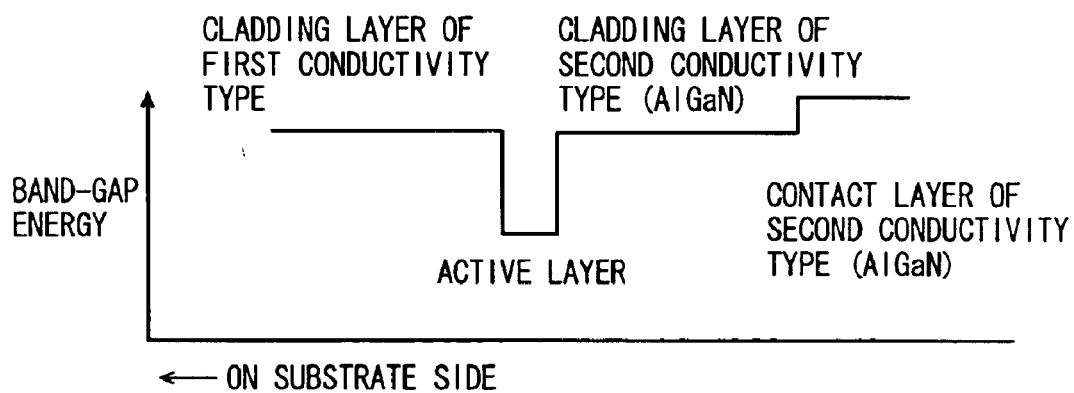
FIG. 18 is a diagram showing a second example of band-gap energies in a cladding layer of a first conductivity type, an active layer, a cladding layer of a second conductivity type, and a contact layer of a second conductivity type in the semiconductor laser device according to the present invention.

In the example shown in FIG. 18, the band-gap of the cladding layer of a second conductivity type composed of AlGaN is larger than the band-gap of the active layer, and the band-gap of the contact layer of a second conductivity type composed of AlGaN is larger than the band-gap of the cladding layer of a second conductivity type.

Figure 19:
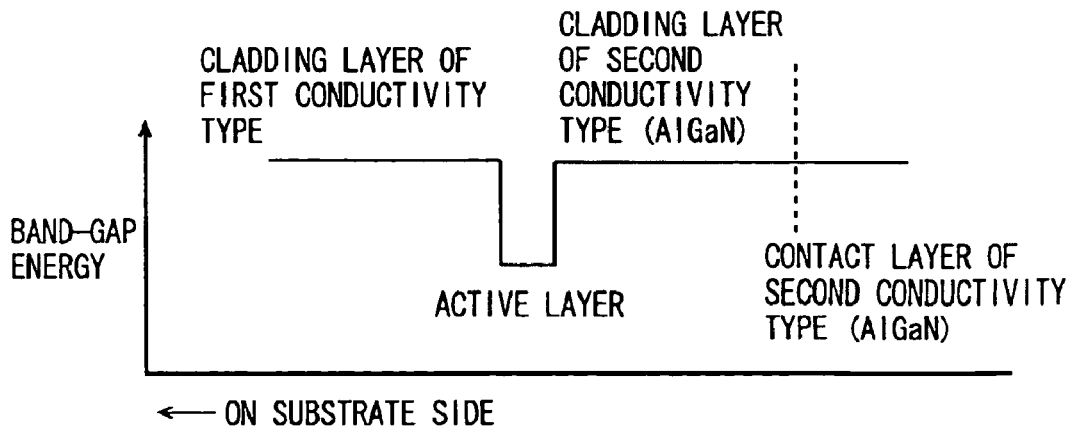
FIG. 19 is a diagram showing a third example of band-gap energies in a cladding layer of a first conductivity type, an active layer, a cladding layer of a second conductivity type, and a contact layer of a second conductivity type in the semiconductor laser device according to the present invention.

In the example shown in FIG. 19, the band-gap of the cladding layer of a second conductivity type composed of AlGaN is larger than the band-gap of the active layer, and the band-gap of the contact layer of a second conductivity type composed of AlGaN is equal to the band-gap of the cladding layer of a second conductivity type.

Figure 20:
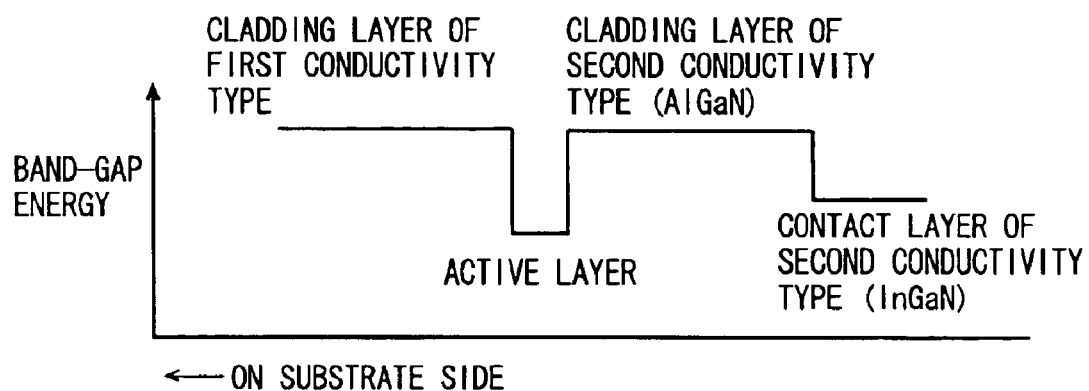
FIG. 20 is a diagram showing a fourth example of band-gap energies in a cladding layer of a first conductivity type, an active layer, a cladding layer of a second conductivity type, and a contact layer of a second conductivity type in the semiconductor laser device according to the present invention.

In the example shown in FIG. 20, the band-gap of the cladding layer of a second conductivity type composed of AlGaN is larger than the band-gap of the active layer and the band-gap of the contact layer of a second conductivity type composed of InGaN, and the band-gap of the contact layer of a second conductivity type is larger than the band-gap of the active layer.

Figure 21:
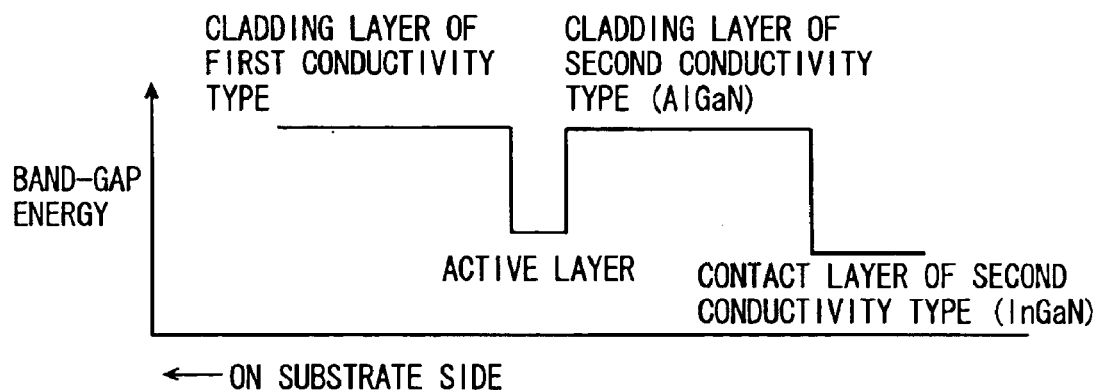
FIG. 21 is a diagram showing a fifth example of band-gap energies in a cladding layer of a first conductivity type, an active layer, a cladding layer of a second conductivity type, and a contact layer of a second conductivity type in the semiconductor laser device according to the present invention.
Figure 22:
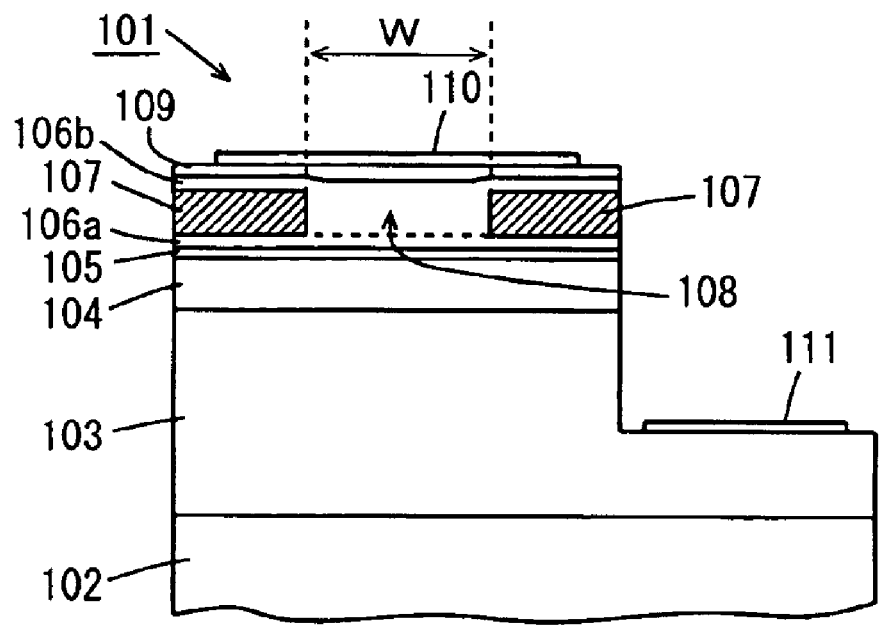
FIG. 22 is a schematic sectional view showing the steps of a first example of the construction of a conventional GaN based semiconductor laser device.
Figure 23:
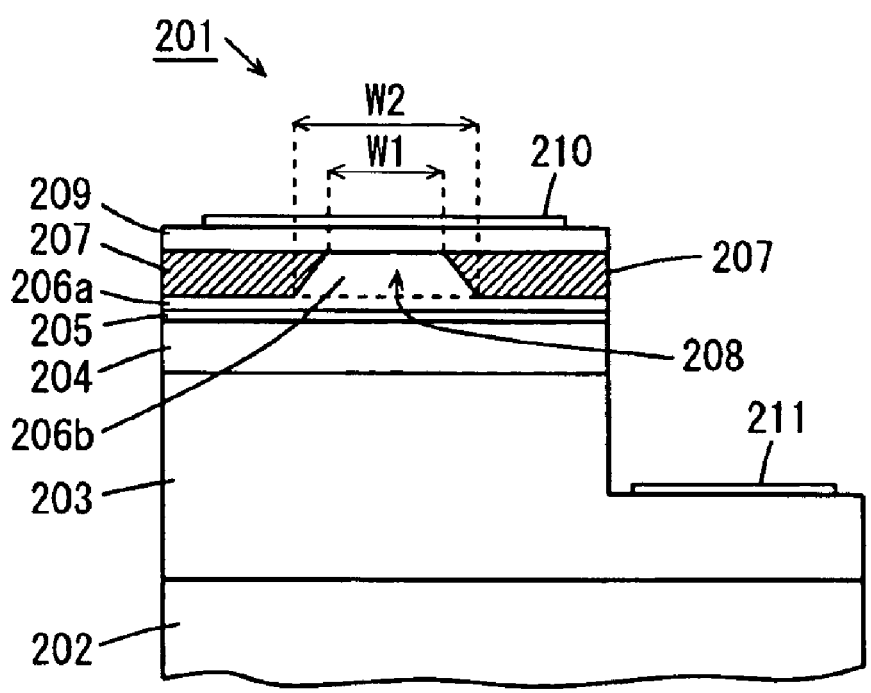
FIG. 23 is a schematic sectional view showing the steps of a second example of the construction of a conventional GaN based semiconductor laser device.

In the example shown in FIG. 21, the band-gap of the cladding layer of a second conductivity type composed of AlGaN is larger than the band-gap of the active layer and the band-gap of the contact layer of a second conductivity type composed of InGaN, and the band-gap of the contact layer of a second conductivity type is smaller than the band-gap of the active layer.

In the examples shown in FIGS. 17 to 21, the carrier concentration of the contact layer of a second conductivity type is set to not less than the carrier concentration of the cladding layer of a second conductivity type.

Particularly in the example shown in FIG. 17, the contact layer of a second conductivity type is formed of GaN, thereby making it possible to increase the carrier concentration thereof. Consequently, good ohmic contact can be obtained between the contact layer of a second conductivity type and an electrode. As a result, an operating voltage in the semiconductor laser device is reduced, thereby making it possible to prevent the semiconductor laser device from generating heat. As a result, it is possible to reduce a threshold current and improve reliability.

Furthermore, the band-gap of the contact layer of a second conductivity type is larger than the band-gap of the active layer. Accordingly, the light emission efficiency is prevented from being decreased by the absorption of light in the contact layer of a second conductivity type.

The material of each of the layers in the semiconductor laser device according to the present invention is not limited to the above-mentioned materials in the embodiments. It is possible to use various types of nitride based semiconductors containing at least one of B, Tl, Ga, Al, and In.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor layer device comprising:
  a first semiconductor layer made of a nitride based semiconductor and including an active layer;
  a striped second semiconductor layer along a <1$\bar{1}$00> direction or <11$\bar{2}$0> directions made of a nitride based semiconductor and formed on said first semiconductor layer; and
  a current blocking layer formed over said first semiconductor layer on both sides of said second semiconductor layer,
  said second semiconductor layer including a cladding layer which comprises a lower layer having a first width at its lower end and an upper layer having a second width larger than said first width at its lower end, both of said lower layer and said upper layer having a larger band-gap than that of said active layer.

2. The semiconductor laser device according to claim 1, wherein
  said cladding layer has the function of confining light in said active layer.

3. The semiconductor laser device according to claim 1, wherein
  said cladding layer has a first carrier concentration,
  said semiconductor laser device further comprising
  a third semiconductor layer formed on said cladding layer and having a second carrier concentration which is not less than said first carrier concentration of said cladding layer.

4. The semiconductor laser device according to claim 3, wherein said third semiconductor layer is a contact layer.

5. The semiconductor laser device according to claim 1, further comprising
  a third semiconductor layer formed on said cladding layer and having a smaller band-gap than that of said cladding layer.

6. The semiconductor laser device according to claim 5, wherein
  said third semiconductor layer is a contact layer.

7. The semiconductor laser device according to claim 1, wherein
  said lower layer in said cladding layer has said first width which is approximately constant from its lower end to its upper end, and
  said upper layer in said cladding layer has a second width which is approximately constant from its lower end to its upper end.

8. The semiconductor laser device according to claim 1, wherein
  said lower layer in said cladding layer has said first width which is approximately constant from its lower end to its upper end, and
  said upper layer in said cladding layer has a width which gradually decreases upward from said second width.

9. The semiconductor laser device according to claim 1, wherein
  said first semiconductor layer comprises a cladding layer of a first conductivity type, said active layer, and a first cladding layer of a second conductivity type in this order from its bottom, and
  said second semiconductor layer comprises a second cladding layer of a second conductivity type as said cladding layer.

10. The semiconductor laser device according to claim 1, wherein
  said first semiconductor layer is a first nitride based semiconductor layer containing at least one of boron, thallium, gallium, aluminum, and indium,
  said second semiconductor layer is a second nitride based semiconductor layer containing at least one of boron, thallium, gallium, aluminum, and indium, and
  said current blocking layer is a third nitride based semiconductor layer containing at least one of boron, thallium, gallium, aluminum, and indium.

11. A method of fabricating a semiconductor laser device, comprising the steps of:
  forming a first semiconductor layer made of a nitride based semiconductor and including an active layer; and
  forming a striped second semiconductor layer along a <1$\bar{1}$00> direction or <11$\bar{2}$0> directions made of a nitride based semiconductor on said first semiconductor layer, and forming a current blocking layer over said first semiconductor layer on both sides of said second semiconductor layer,
  the step of forming said second semiconductor layer comprising the step of forming a cladding layer which comprises a lower layer having a first width at its lower end and an upper layer having a second width larger than said first width at its lower end, both of said lower layer and said upper layer having a larger band-gap than that of said active layer.

12. The method according to claim 11, wherein
  the step of forming said second semiconductor layer and said current blocking layer comprises the steps of
  forming a current blocking layer on said first semiconductor layer,
  forming on said current blocking layer a first mask pattern having a first striped opening,
  etching said current blocking layer inside said first striped opening of said first mask pattern by a first depth, to form a striped recess in said current blocking layer,
  removing said first mask pattern, and then forming a second mask pattern having a second striped opening wider than said striped recess of said current blocking layer on said current blocking layer on both sides of said striped recess,
  etching said current blocking layer inside said second striped opening of said second mask pattern to a second depth at which said first semiconductor layer is exposed, to form in said current blocking layer a striped opening which stepwise widens from a lower end to an upper end of said current blocking layer, and
  removing said second mask pattern, and then forming said second semiconductor layer on said current blocking layer and on said first semiconductor layer inside said striped opening of said current blocking layer.

13. The method according to claim 11, wherein
  the step of forming said second semiconductor layer and said current blocking layer comprises the steps of forming a current blocking layer on said first semiconductor layer, forming on said current blocking layer a first mask pattern having a first striped opening and composed of a first material, forming a second mask pattern having a second striped opening narrower than said first striped opening of said first mask pattern and composed of a second material different from said first material on said current blocking layer inside the first striped opening and on said first mask pattern, etching said current blocking layer inside said second striped opening of said second mask pattern by a first depth, to form a striped recess in said current blocking layer, removing said second mask pattern, and then etching said current blocking layer inside said first striped opening of said first mask pattern to a second depth at which said first semiconductor layer is exposed, to form in said current blocking layer a striped opening which stepwise widens from a lower end to an upper end of said current blocking layer, and removing said first mask pattern, and then forming said second semiconductor layer on said current blocking layer and on said first semiconductor layer inside said striped opening of the current blocking layer.

14. The method according to claim 11, wherein the step of forming said second semiconductor layer and said current blocking layer comprises the steps of forming a first current blocking layer on said first semiconductor layer, forming on said first current blocking layer a first mask pattern having a first striped opening, etching said current blocking layer inside said first striped opening of said first mask pattern, to form a striped opening in said first current blocking layer, removing said first mask pattern, and then forming a second semiconductor layer on said first current blocking layer and on said first semiconductor layer inside said striped opening of said first current blocking layer, forming a striped second mask pattern in a region on said second semiconductor layer above said striped opening of said first current blocking layer, etching said second semiconductor layer, except in a region of said second mask pattern to expose said first current blocking layer on both sides of said second mask pattern, to form in said second semiconductor layer a lower layer having said first width which is approximately constant from its lower end to its upper end and an upper layer having a width which gradually decreases upward from said second width, and selectively forming a second current blocking layer on said first current blocking layer, except in a region on said second mask pattern.

15. The method according to claim 11, wherein the step of forming said second semiconductor layer and said current blocking layer comprises the steps of forming on said first semiconductor layer a first mask pattern having a striped opening, selectively growing a second semiconductor layer on said first semiconductor layer inside said striped opening and on said first mask pattern in the periphery of said striped opening, removing said first mask pattern, and then forming a second mask pattern on an upper surface of said second semiconductor layer, and selectively growing a current blocking layer on said first semiconductor layer on both sides of said second semiconductor layer, except on said second mask pattern.

16. The method according to claim 11, further comprising the step of forming on said cladding layer a third semiconductor layer having a smaller band-gap than that of said cladding layer.

17. The method according to claim 11, further comprising the step of forming on said cladding layer a third semiconductor layer having a carrier concentration which is not less than that of said cladding layer.

18. The method according to claim 11, wherein the step of forming said cladding layer comprises the step of forming a lower layer having said first width which is approximately constant from its lower end to its upper end and an upper layer having said second width which is approximately constant from its lower end to its upper end.

19. The method according to claim 11, wherein the step of forming said cladding layer comprises the step of forming a lower layer having said first width which is approximately constant from its lower end to its upper end and an upper layer having a width which gradually decreases upward from said second width.

20. The method according to claim 11, wherein the step of forming said first semiconductor layer comprises the step of forming a cladding layer of a first conductivity type, said active layer, and a first cladding layer of a second conductivity type in this order from its bottom, and the step of forming said second semiconductor layer comprises the step of forming a second cladding layer of a second conductivity type as said cladding layer.

21. The method according to claim 11, wherein said first semiconductor layer is a first nitride based semiconductor layer containing at least one of boron, thallium, gallium, aluminum, and indium, said second semiconductor layer is a second nitride based semiconductor layer containing at least one of boron, thallium, gallium, aluminum, and indium, and said current blocking layer is a third nitride based semiconductor layer containing at least one of boron, thallium, gallium, aluminum, and indium.

* * * * *

UNITED STATES PATENT AND TRADEMARK OFFICE
CERTIFICATE OF CORRECTION

PATENT NO. : 6,904,071 B1
DATED : June 7, 2005
INVENTOR(S) : Takenori Goto et al.

It is certified that error appears in the above-identified patent and that said Letters Patent is hereby corrected as shown below:

<u>Title page,</u>
Item [56], References Cited, FOREIGN PATENT DOCUMENTS, correct "JP 02001068786 A" to -- JP 02001067886 A --.

Signed and Sealed this

Seventeenth Day of January, 2006

JON W. DUDAS
*Director of the United States Patent and Trademark Office*